United States Patent
Wu et al.

(10) Patent No.: US 11,276,705 B2
(45) Date of Patent: Mar. 15, 2022

(54) EMBEDDED BONDED ASSEMBLY AND METHOD FOR MAKING THE SAME

(71) Applicant: SANDISK TECHNOLOGIES LLC, Addison, TX (US)

(72) Inventors: Chen Wu, Leuven (BE); Peter Rabkin, Cupertino, CA (US); Yangyin Chen, Leuven (BE); Masaaki Higashitani, Cupertino, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 134 days.

(21) Appl. No.: 16/552,089

(22) Filed: Aug. 27, 2019

(65) Prior Publication Data
US 2021/0066317 A1 Mar. 4, 2021

(51) Int. Cl.
| | |
|---|---|
| *H01L 27/1158* | (2017.01) |
| *H01L 27/11573* | (2017.01) |
| *H01L 27/11565* | (2017.01) |
| *H01L 27/1157* | (2017.01) |
| *H01L 27/11524* | (2017.01) |
| *H01L 27/11514* | (2017.01) |
| *H01L 27/11519* | (2017.01) |
| *H01L 27/11553* | (2017.01) |
| *H01L 27/11504* | (2017.01) |
| *H01L 27/11507* | (2017.01) |
| *H01L 27/11529* | (2017.01) |

(52) U.S. Cl.
CPC ...... *H01L 27/1158* (2013.01); *H01L 27/1157* (2013.01); *H01L 27/11504* (2013.01); *H01L 27/11507* (2013.01); *H01L 27/11514* (2013.01); *H01L 27/11519* (2013.01); *H01L 27/11524* (2013.01); *H01L 27/11529* (2013.01); *H01L 27/11553* (2013.01); *H01L 27/11565* (2013.01); *H01L 27/11573* (2013.01)

(58) Field of Classification Search
None
See application file for complete search history.

(56) References Cited

U.S. PATENT DOCUMENTS

| | | | |
|---|---|---|---|
| 10,115,681 B1 | 10/2018 | Ariyoshi | |
| 10,283,493 B1 | 5/2019 | Nishida | |
| 10,354,980 B1 | 7/2019 | Mushiga et al. | |
| 10,354,987 B1 | 7/2019 | Mushiga | |
| 10,381,322 B1 | 8/2019 | Azuma et al. | |
| 10,381,362 B1 | 8/2019 | Cui et al. | |

(Continued)

FOREIGN PATENT DOCUMENTS

| | | |
|---|---|---|
| KR | 10-2008-0070097 A | 7/2008 |
| WO | WO2019143400 A1 | 7/2019 |

OTHER PUBLICATIONS

Endoh, T. et al., "Novel Ultra High Density Flash Memory with A Stacked-Surrounding Gate Transistor (S-GT) Structured Cell," IEDM Proc., pp. 33-36, (2001).

(Continued)

*Primary Examiner* — Daniel Whalen
(74) *Attorney, Agent, or Firm* — The Marbury Law Group PLLC

(57) ABSTRACT

A semiconductor structure includes a first semiconductor die containing a recesses, and a second semiconductor die which is embedded in the recess in the first semiconductor die and is bonded to the first semiconductor die.

10 Claims, 35 Drawing Sheets

(56) References Cited

U.S. PATENT DOCUMENTS

| | | | |
|---|---|---|---|
| 2005/0014333 A1 | 1/2005 | Kim | |
| 2005/0047643 A1 | 3/2005 | Lowe | |
| 2005/0110125 A1 | 5/2005 | Blackshear | |
| 2009/0294992 A1 | 12/2009 | Toyama et al. | |
| 2013/0277865 A1 | 10/2013 | Teh et al. | |
| 2016/0204067 A1 | 7/2016 | Chase et al. | |
| 2016/0322340 A1* | 11/2016 | Li | H01L 23/055 |
| 2017/0025392 A1 | 1/2017 | Teh et al. | |
| 2019/0006325 A1 | 1/2019 | Teh et al. | |
| 2019/0221557 A1 | 7/2019 | Kim et al. | |
| 2019/0252361 A1 | 8/2019 | Nishida | |
| 2021/0159215 A1* | 5/2021 | Wu | H01L 25/50 |
| 2021/0159216 A1* | 5/2021 | Wu | H01L 21/76898 |

OTHER PUBLICATIONS

U.S. Appl. No. 16/276,996, filed Feb. 15, 2019, SanDisk Technologies LLC.

U.S. Appl. No. 16/521,849, filed Jul. 25, 2019, SanDisk Technologies LLC.

U.S. Appl. No. 16/284,502, filed Feb. 25, 2019, SanDisk Technologies LLC.

U.S. Appl. No. 16/231,752, filed Dec. 24, 2018, SanDisk Technologies LLC.

U.S. Appl. No. 16/278,372, filed Feb. 18, 2019, SanDisk Technologies LLC.

U.S. Appl. No. 16/295,292, filed Mar. 7, 2019, SanDisk Technologies LLC.

U.S. Appl. No. 16/385,010, filed Apr. 16, 2019, SanDisk Technologies LLC.

U.S. Appl. No. 16/409,593, filed May 10, 2019, SanDisk Technologies LLC.

U.S. Appl. No. 16/248,923, filed Jan. 16, 2019, SanDisk Technologies LLC.

U.S. Appl. No. 16/274,687, filed Feb. 13, 2019, SanDisk Technologies LLC.

U.S. Appl. No. 16/291,457, filed Mar. 4, 2019, SanDisk Technologies LLC.

U.S. Appl. No. 16/291,504, filed Mar. 4, 2019, SanDisk Technologies LLC.

U.S. Appl. No. 16/291,577, filed Mar. 4, 2019, SanDisk Technologies LLC.

U.S. Appl. No. 16/242,216, filed Jan. 8, 2019, SanDisk Technologies LLC.

U.S. Appl. No. 16/255,413, filed Jan. 23, 2019, SanDisk Technologies LLC.

U.S. Appl. No. 16/249,423, filed Jan. 16, 2019, SanDisk Technologies LLC.

U.S. Appl. No. 16/276,952, filed Feb. 15, 2019, SanDisk Technologies LLC.

U.S. Appl. No. 16/269,301, filed Feb. 6, 2019, SanDisk Technologies LLC.

U.S. Appl. No. 16/275,668, filed Feb. 14, 2019, SanDisk Technologies LLC.

U.S. Appl. No. 16/288,656, filed Feb. 28, 2019, SanDisk Technologies LLC.

U.S. Appl. No. 16/372,908, filed Apr. 2, 2019, SanDisk Technologies LLC.

U.S. Appl. No. 16/417,913, filed May 21, 2019, SanDisk Technologies LLC.

U.S. Appl. No. 16/391,632, filed Apr. 23, 2019, SanDisk Technologies LLC.

U.S. Appl. No. 16/440,183, filed Jun. 13, 2019, SanDisk Technologies LLC.

U.S. Appl. No. 16/523,029, filed Jul. 26, 2019, SanDisk Technologies LLC.

Notification of Transmittal of the International Search Report and Written Opinion of the International Search Authority for International Patent Application No. PCT/US2020/026106, dated Jul. 30, 2020, 9 pages.

* cited by examiner

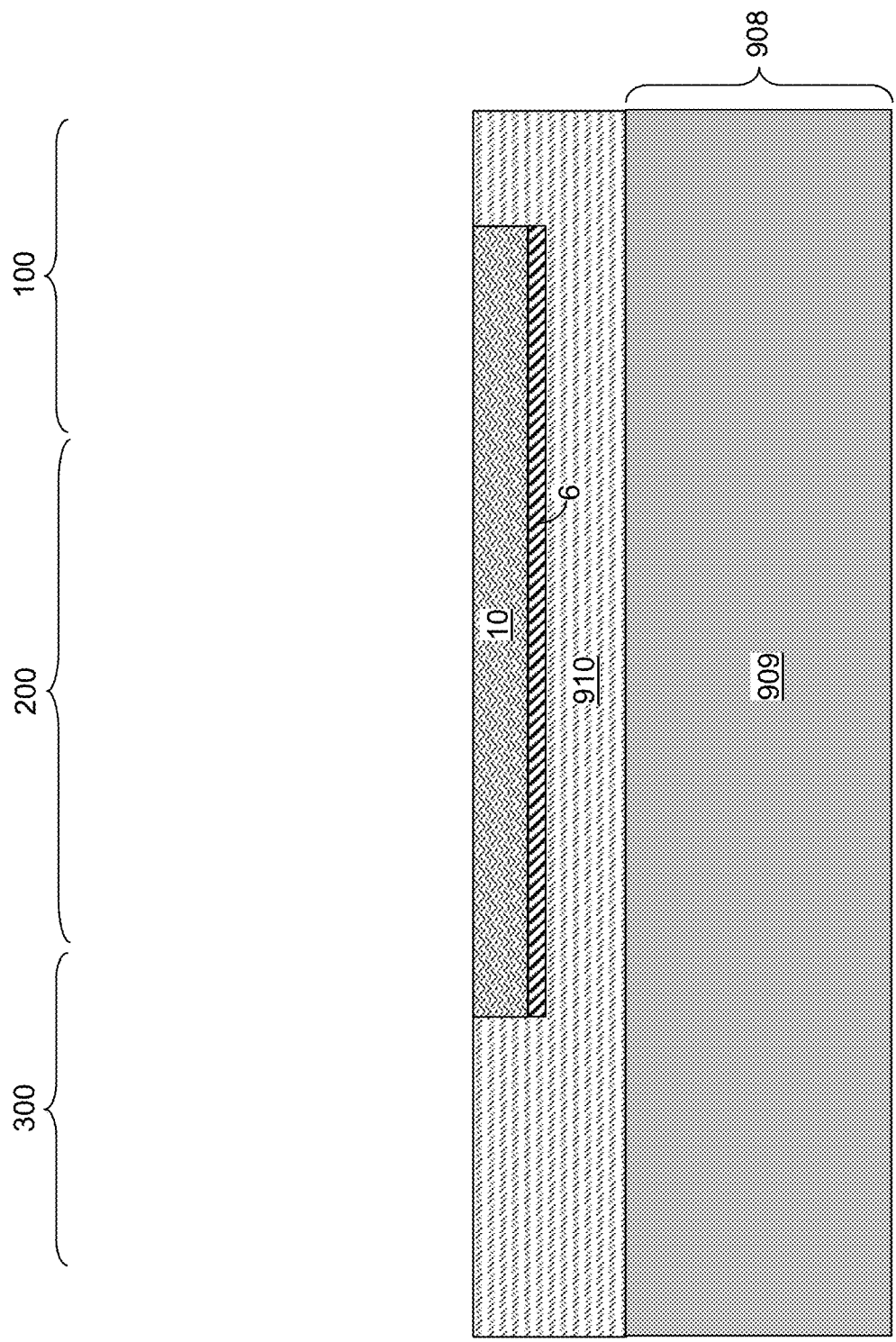

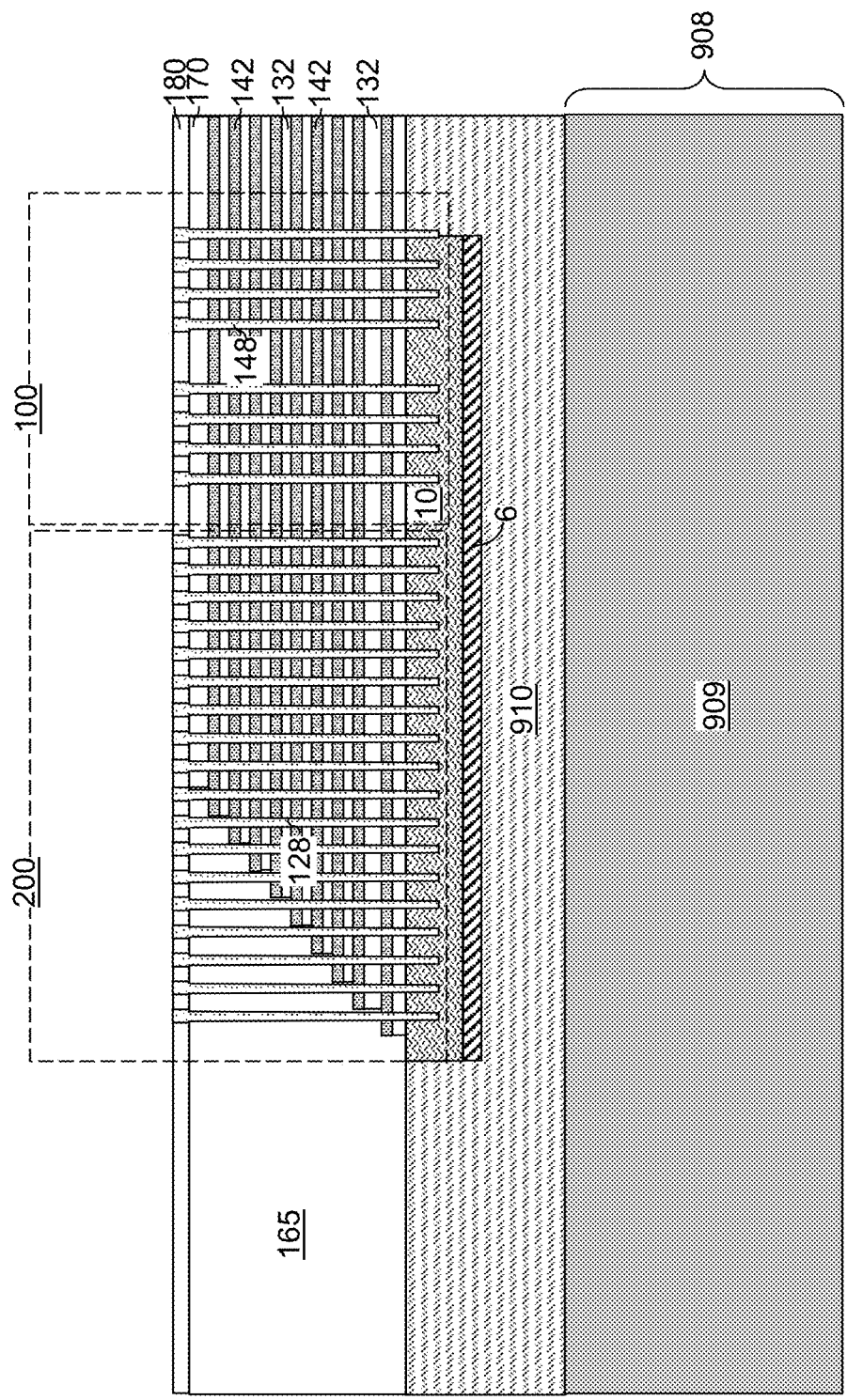

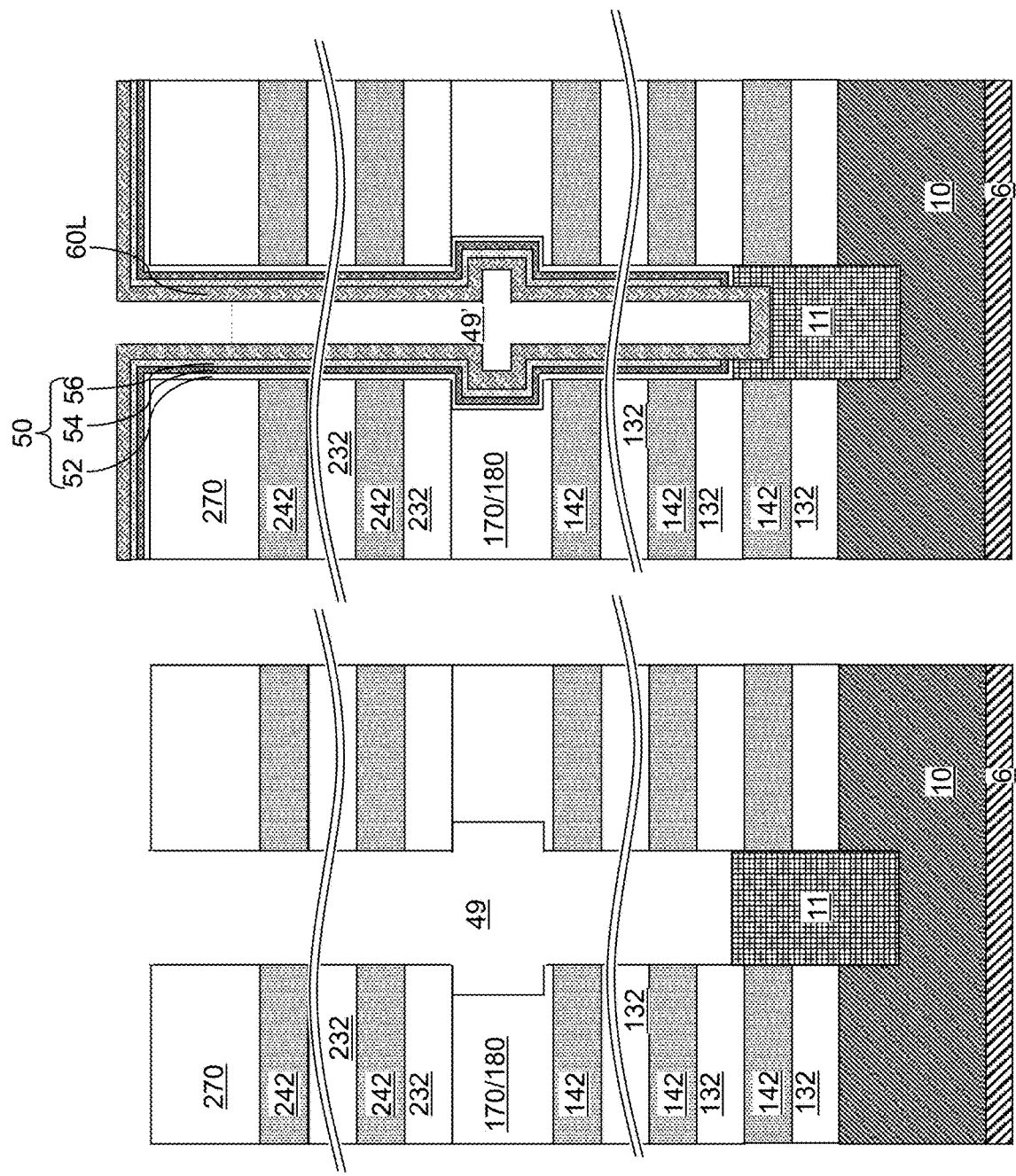

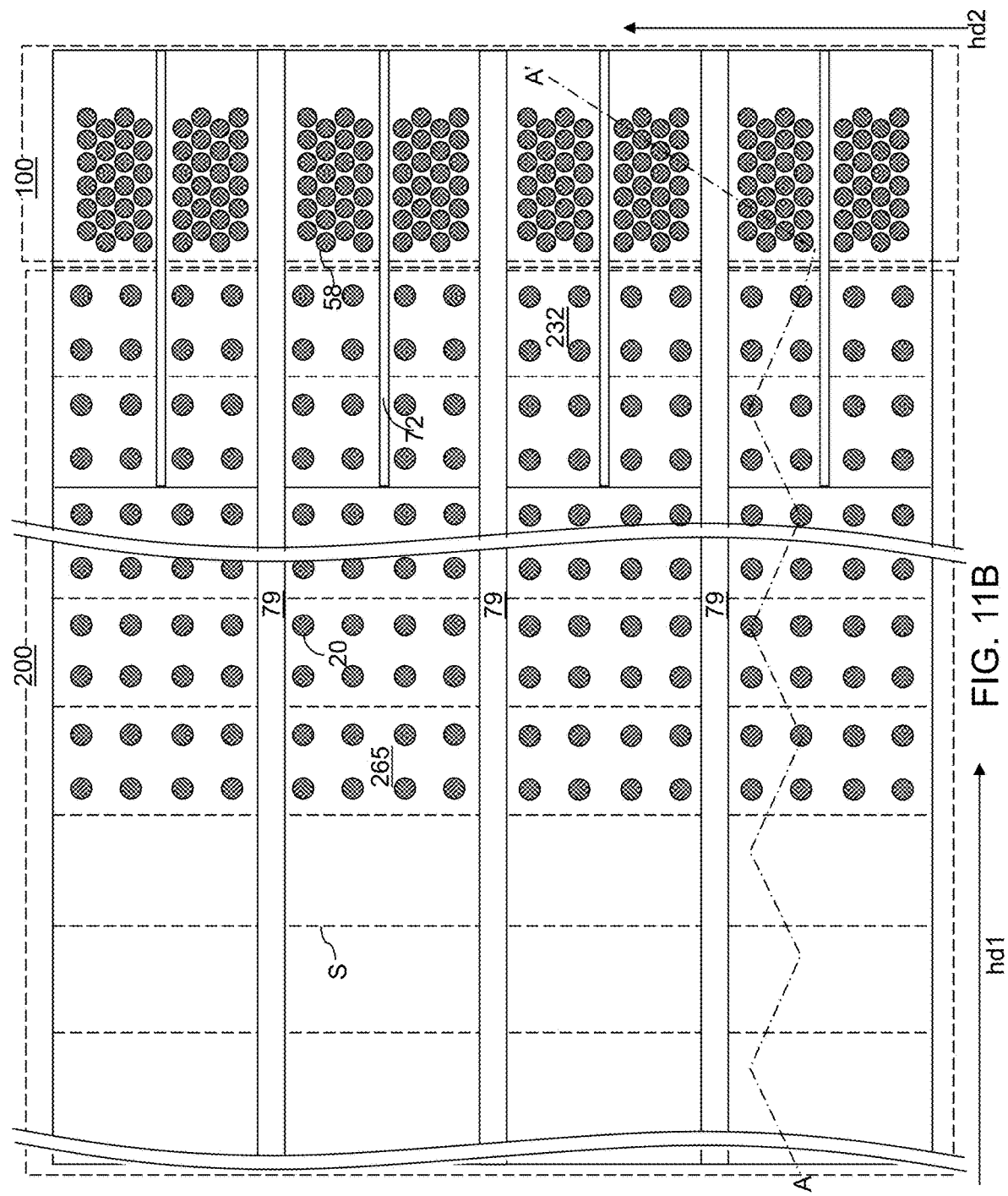

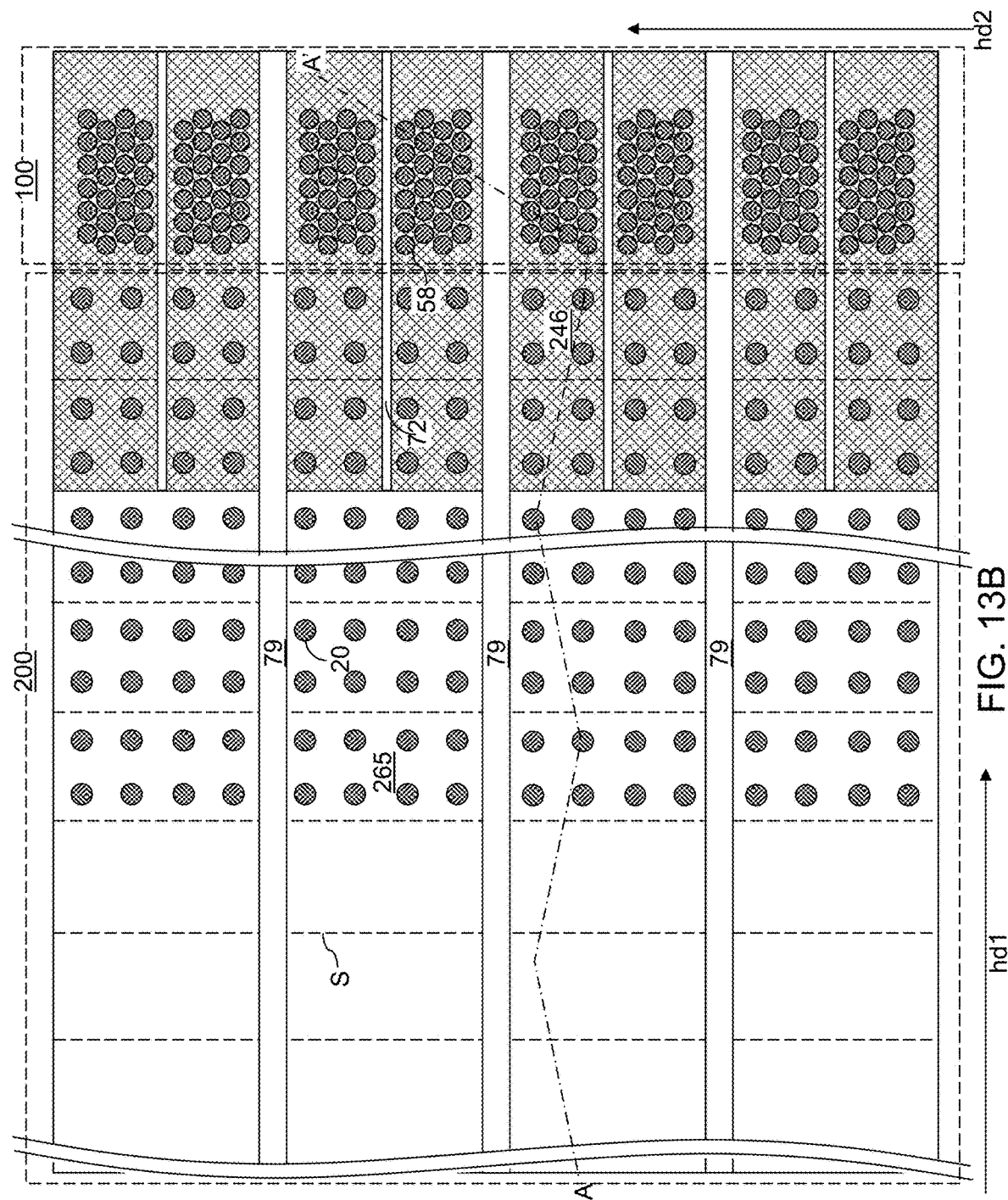

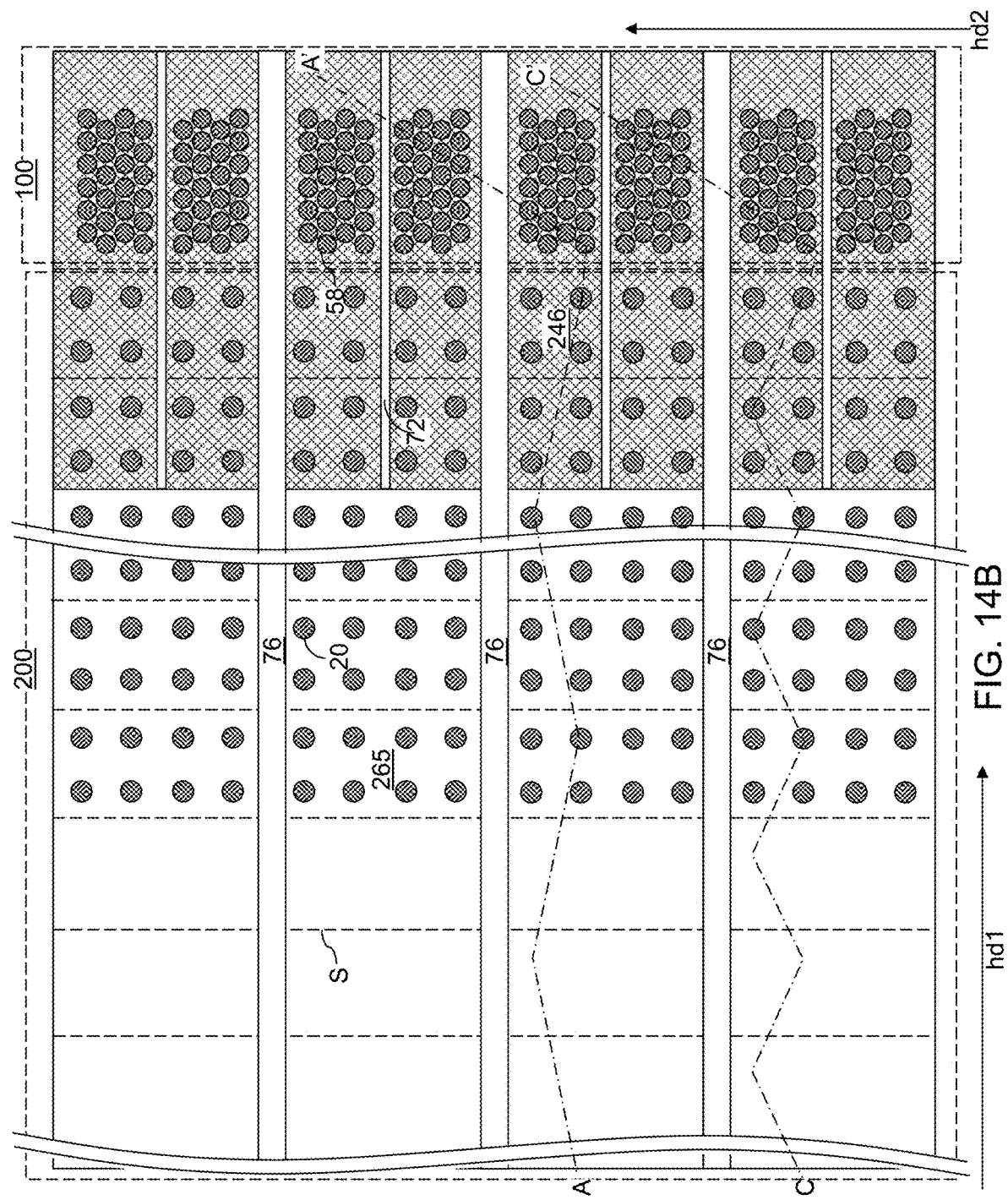

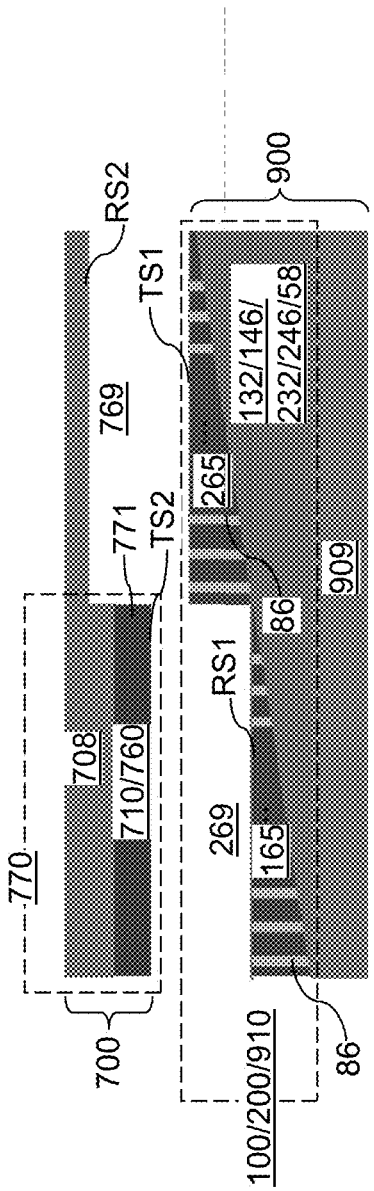
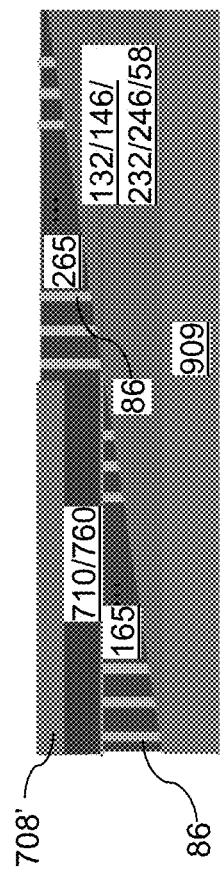
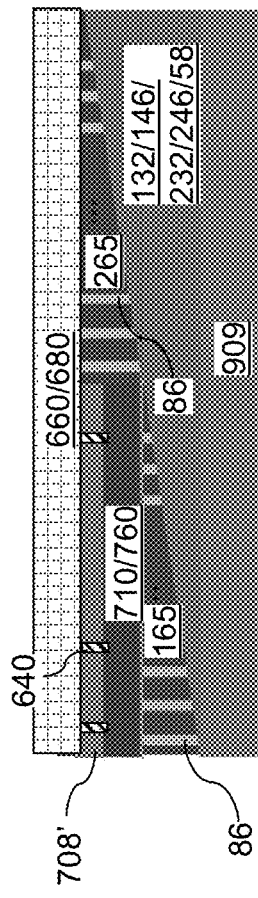
FIG. 20A
FIG. 20B
FIG. 20C

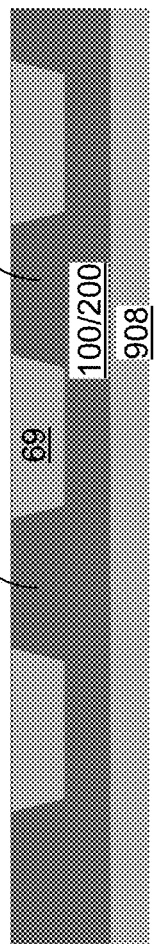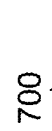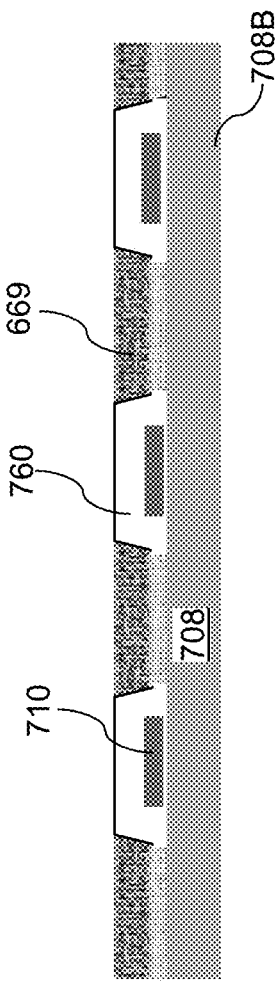
FIG. 21A
FIG. 21B

US 11,276,705 B2

EMBEDDED BONDED ASSEMBLY AND METHOD FOR MAKING THE SAME

FIELD

The present disclosure relates generally to the field of semiconductor devices, and particular to methods for forming an embedded bonded assembly, which may for example, include a three-dimensional memory die and a logic die, and method for making the same.

BACKGROUND

A three-dimensional memory device including three-dimensional vertical NAND strings having one bit per cell is disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an embodiment of the present disclosure, a semiconductor structure includes a first semiconductor die containing a recesses, and a second semiconductor die which is embedded in the recess in the first semiconductor die and is bonded to the first semiconductor die.

According to another embodiment of the present disclosure, a method of forming a semiconductor structure comprises providing a first semiconductor die containing a recesses, embedding a second semiconductor die in the recess in the first semiconductor die, and bonding the first semiconductor die to the second semiconductor die.

BRIEF DESCRIPTION OF THE DRAWINGS

FIG. 1A is a vertical cross-sectional view of a region of an exemplary structure for forming a first semiconductor die after formation of a source-side dielectric material layer and a doped semiconductor layer on a semiconductor substrate according to the first embodiment of the present disclosure.

FIG. 5 is a vertical cross-sectional view of the exemplary structure after formation of various sacrificial fill structures according to the first embodiment of the present disclosure.

FIGS. 9A-9D illustrate sequential vertical cross-sectional views of a memory opening during formation of a memory opening fill structure according to the first embodiment of the present disclosure.

FIG. 11B is a horizontal cross-sectional of the exemplary structure along the horizontal plane B-B' of FIG. 11A. The hinged vertical plane A-A' corresponds to the plane of the vertical cross-sectional view of FIG. 11A.

FIG. 13B is a horizontal cross-sectional of the exemplary structure along the horizontal plane B-B' of FIG. 13A. The hinged vertical plane A-A' corresponds to the plane of the vertical cross-sectional view of FIG. 13A.

FIG. 14B is a horizontal cross-sectional of the exemplary structure along the horizontal plane B-B' of FIG. 14A. The hinged vertical plane A-A' corresponds to the plane of the vertical cross-sectional view of FIG. 14A.

FIG. 20A-20C are sequential vertical cross-sectional views of an exemplary structure during formation of a bonded assembly according to the first embodiment of the present disclosure.

FIGS. 21A and 21B are respective vertical cross-sectional views of portions of first and second semiconductor die according to a second embodiment of the present disclosure.

DETAILED DESCRIPTION

Figure 1B:
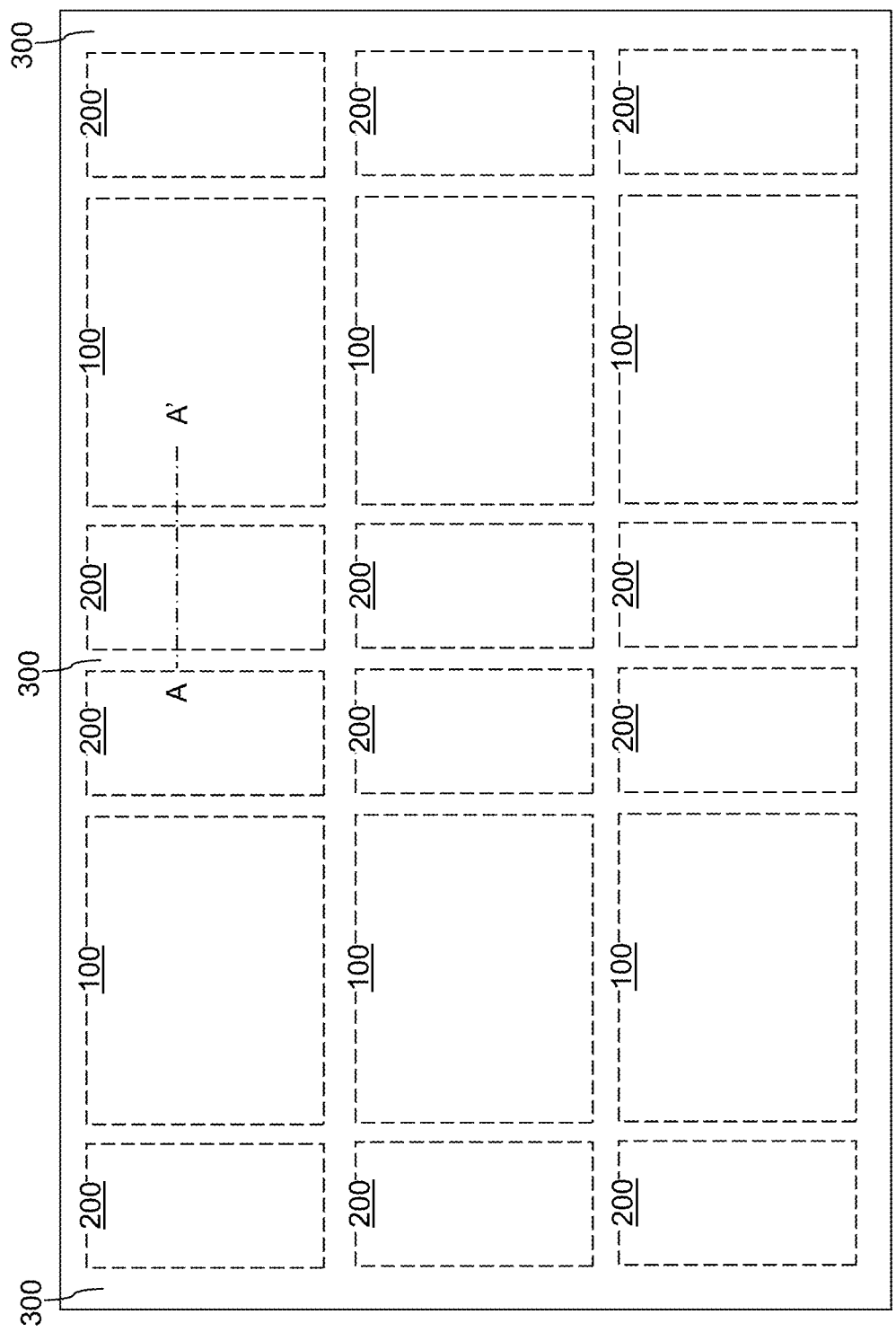
FIG. 1B is a top-down view of the exemplary structure of FIG. 1A. The vertical plane A-A' corresponds to the plane of the vertical cross-sectional view of FIG. 1A.

A bonded assembly, such as an assembly including a three-dimensional memory die and a logic die, can be formed by wafer bonding or die-to-die bonding. Generally, the total thickness of the bonded assembly is significantly thicker than the thickness of a single unbonded die, which may cause additional challenges during subsequent processing steps, such as packaging. The embodiments of the present disclosure are directed to methods for forming a thin bonded assembly, in which one die is embedded in and bonded to another die, the various aspects of which are described in detail.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element may be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^{5}$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^{5}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^{5}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device The various three-dimensional memory devices of the present disclosure include a monolithic three-dimensional NAND string memory device, and may be fabricated using the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many external commands as the total number of planes therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Referring to FIGS. 1A and 1B, an exemplary structure according to the first embodiment of the present disclosure is illustrated, which includes an in-process memory die. As used herein, a memory die is a semiconductor die including an array of memory elements. As such, an in-process memory die is a structure that is subsequently modified to form a memory die.

The first exemplary structure includes a first substrate 908, which includes a semiconductor substrate layer 909. The first substrate 908 may comprise a commercially available semiconductor wafer such as a single crystalline silicon wafer. A source-side dielectric material layer 910 is formed over the semiconductor substrate layer 909. The source-side dielectric material layer 910 includes a dielectric material such as silicon oxide. The maximum thickness of the source-side dielectric material layer 910 may be in a range from 200 nm to 3,000 nm, although lesser and greater thicknesses may also be used.

An optional metallic plate layer 6 and a source semiconductor layer 10 may be may be formed in the source-side dielectric material layer 910. The optional metallic plate layer 6, if present, provides a high conductivity conduction path for electrical current that flows into, along, and/or out of, the source semiconductor layer 10. The optional metallic plate layer 6 includes a conductive material such as a metal or a heavily doped semiconductor material. The optional metallic plate layer 6, for example, may include a tungsten layer having a thickness in a range from 3 nm to 100 nm, although lesser and greater thicknesses may also be used. A metal nitride layer (not shown) may be provided as a diffusion barrier layer on top of the metallic plate layer 6. The metallic plate layer 6 may function as a component of a source line in a completed die. The thickness of the metallic plate layer 6 may be in a range from 20 nm to 200 nm, although lesser and greater thicknesses may also be used.

The source semiconductor layer 10 is a doped semiconductor layer having a doping of the opposite conductivity type of the conductivity type of vertical semiconductor channels to be subsequently formed. For example, if vertical semiconductor channels to be subsequently formed have a doping of a first conductivity type, the source semiconductor layer 10 may have a doping of a second conductivity type that is the opposite of the first conductivity type. For example, if the first conductivity type is p-type, the second conductivity type is n-type, and vice versa. The atomic concentration of second conductivity type dopants in the source semiconductor layer 10 may be in a range from $5.0 \times 10^{19}/cm^{3}$ to $2.0 \times 10^{21}/cm^{3}$, although lesser and greater atomic concentrations may also be used. The thickness of the source semiconductor layer 10 may be in a range from 100 nm to 600 nm, although lesser and greater thicknesses may also be used.

The source semiconductor layer 10 and the metallic plate layer 6 may be patterned such that the source semiconductor layer 10 and the metallic plate layer 6 extend over at least a portion of a memory array region 100 in which memory stack structures are to be subsequently formed and over a staircase region 200 in which stepped surfaces of electrically conductive layers comprising word lines are to be subsequently formed. In one embodiment, the top surface of the source semiconductor layer 10 may be coplanar with the top surface of the source-side dielectric material layer 910. An interlaced array of memory array regions 100 and staircase regions 200 can be provided on the in-process memory die. Optional interstitial regions 300 may be located between adjacent staircase regions 200. While the first embodiment of the present disclosure is illustrated in FIGS. 1A and 2 to 17 as showing a portion of a memory array region 100 and a staircase region 200, it is understood the same structural changes occur in each of the memory array regions 100 and the staircase regions 200 shown in FIG. 1B at the same processing steps. Furthermore, while the first embodiment of the present disclosure is illustrated in FIGS. 1 to 20D as showing a bonded assembly of a memory die and a logic die, it should be understood that the present invention is not so limited, and any two systems or subsystems may be bonded to each other such that one system or subsystem is embedded in the other, as will be described below with respect to the second and third embodiments of the present disclosure, which are illustrated in FIGS. 21A to 25.

Figure 2:
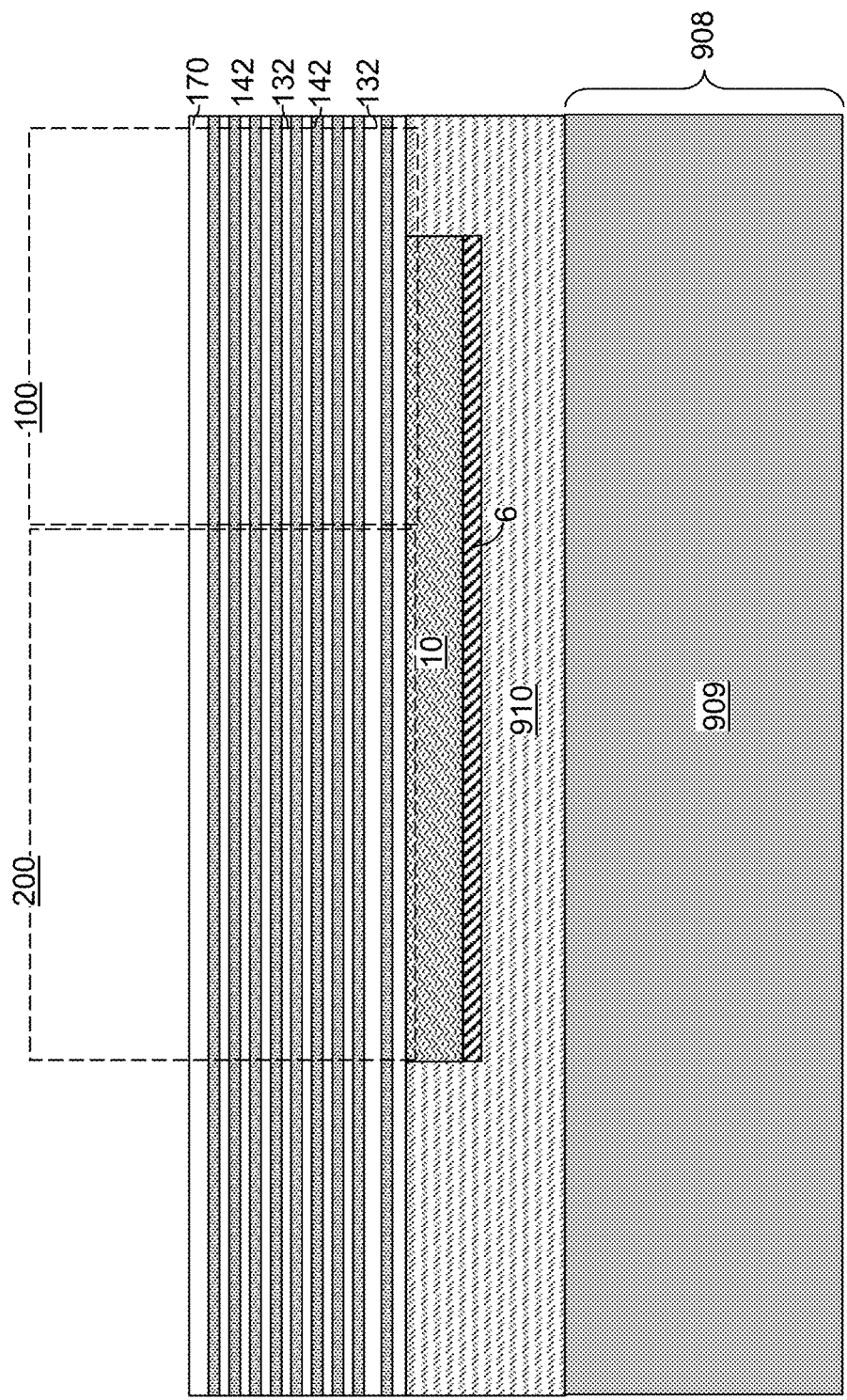
FIG. 2 is a vertical cross-sectional view of the exemplary structure after formation of a first-tier alternating stack of first insulating layers and first spacer material layers according to the first embodiment of the present disclosure.

Referring to FIG. 2, an alternating stack of first material layers and second material layers is subsequently formed. Each first material layer may include a first material, and each second material layer may include a second material that is different from the first material. In case at least another alternating stack of material layers is subsequently formed over the alternating stack of the first material layers and the second material layers, the alternating stack is herein referred to as a first-tier alternating stack. The level of the first-tier alternating stack is herein referred to as a first-tier level, and the level of the alternating stack to be subsequently formed immediately above the first-tier level is herein referred to as a second-tier level, etc.

The first-tier alternating stack may include first insulating layers 132 as the first material layers, and first spacer material layers as the second material layers. In one embodiment, the first spacer material layers may be sacrificial material layers that are subsequently replaced with electrically conductive layers. In another embodiment, the first spacer material layers may be electrically conductive layers that are not subsequently replaced with other layers. While the present disclosure is described using embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers may be first insulating layers 132 and first sacrificial material layers 142, respectively. In one embodiment, each first insulating layer 132 may include a first insulating material, and each first sacrificial material layer 142 may include a first sacrificial material. An alternating plurality of first insulating layers 132 and first sacrificial material layers 142 is formed over the source semiconductor layer 10. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness throughout, or may have different thicknesses. The second elements may have the same thickness throughout, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first-tier alternating stack (132, 142) may include first insulating layers 132 composed of the first material, and first sacrificial material layers 142 composed of the second material, which is different from the first material. The first material of the first insulating layers 132 may be at least one insulating material. Insulating materials that may be used for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 may be silicon oxide.

The second material of the first sacrificial material layers 142 may be a sacrificial material that may be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 may be subsequently replaced with electrically conductive electrodes which may function, for example, as control gate electrodes of a vertical NAND device. In one embodiment, the first sacrificial material layers 142 may be material layers that comprise silicon nitride.

In one embodiment, the first insulating layers 132 may include silicon oxide, and sacrificial material layers may include silicon nitride sacrificial material layers. The first material of the first insulating layers 132 may be deposited, for example, by chemical vapor deposition (CVD). For example, if silicon oxide is used for the first insulating layers 132, tetraethylorthosilicate (TEOS) may be used as the precursor material for the CVD process. The second material of the first sacrificial material layers 142 may be formed, for example, CVD or atomic layer deposition (ALD).

The thicknesses of the first insulating layers 132 and the first sacrificial material layers 142 may be in a range from 20 nm to 50 nm, although lesser and greater thicknesses may be used for each first insulating layer 132 and for each first sacrificial material layer 142. The number of repetitions of the pairs of a first insulating layer 132 and a first sacrificial material layer 142 may be in a range from 2 to 1,024, and typically from 8 to 256, although a greater number of repetitions may also be used. In one embodiment, each first sacrificial material layer 142 in the first-tier alternating stack (132, 142) may have a uniform thickness that is substantially invariant within each respective first sacrificial material layer 142.

A first insulating cap layer 170 is subsequently formed over the first alternating stack (132, 142). The first insulating cap layer 170 includes a dielectric material, which may be any dielectric material that may be used for the first insulating layers 132. In one embodiment, the first insulating cap layer 170 includes the same dielectric material as the first insulating layers 132. The thickness of the first insulating cap layer 170 may be in a range from 20 nm to 300 nm, although lesser and greater thicknesses may also be used.

Figure 3:
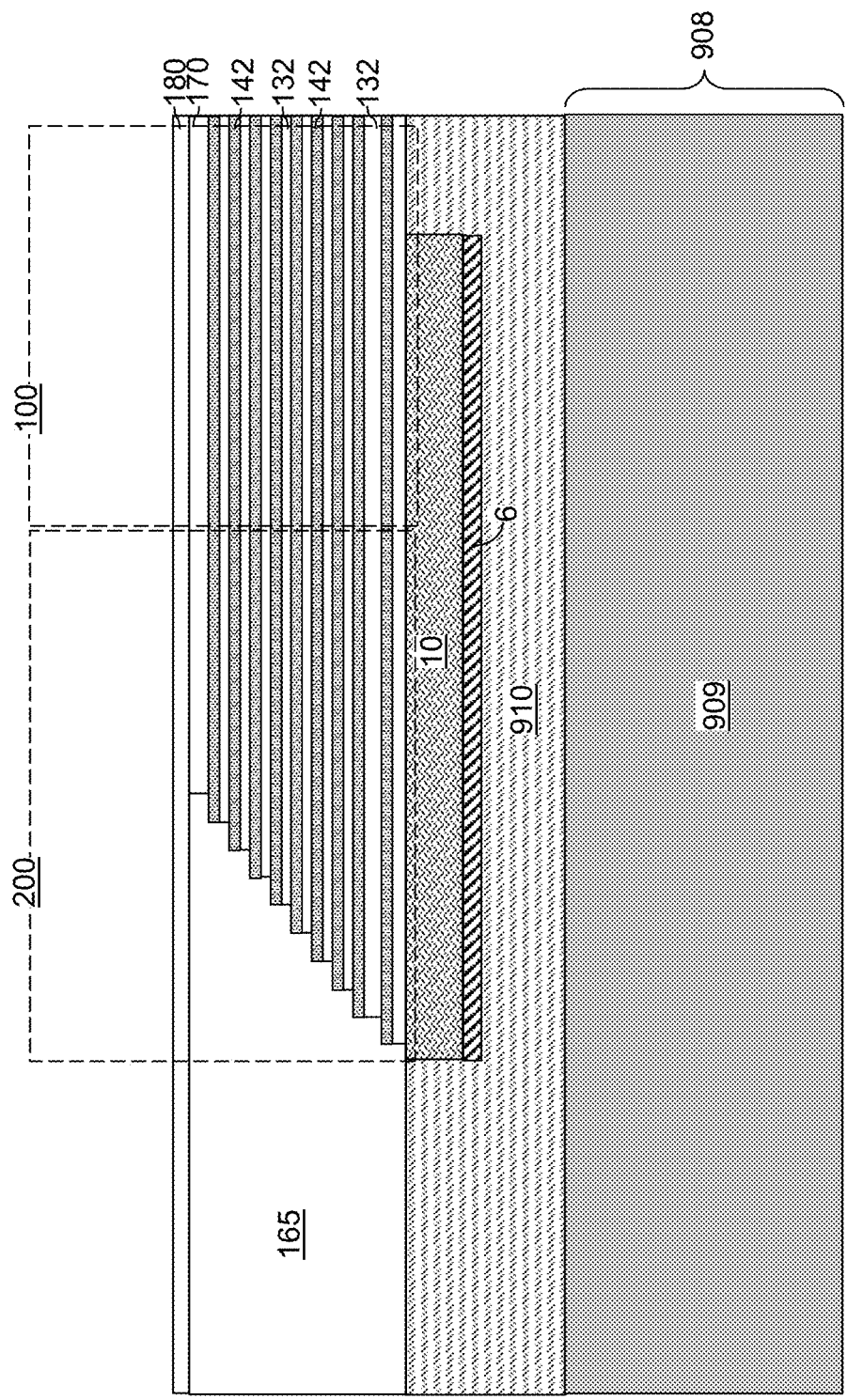
FIG. 3 is a vertical cross-sectional view of the exemplary structure after patterning a first-tier staircase region, a first stepped dielectric material portion, and an inter-tier dielectric layer according to the first embodiment of the present disclosure.

Referring to FIG. 3, the first insulating cap layer 170 and the first-tier alternating stack (132, 142) may be patterned to form first stepped surfaces in the staircase region 200. The staircase region 200 may include a respective first stepped area in which first stepped surfaces are formed, and a second stepped area in which additional stepped surfaces are to be subsequently formed in a second-tier structure (to be subsequently formed over a first-tier structure) and/or additional tier structures. The first stepped surfaces may be formed, for example, by forming a mask layer with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area. In one embodiment, top surfaces of the first sacrificial material layers 142 may be physically exposed at the first stepped surfaces. The cavity overlying the first stepped surfaces is herein referred to as a first stepped cavity.

A dielectric fill material (such as undoped silicate glass or doped silicate glass) may be deposited to fill the first stepped cavity. Excess portions of the dielectric fill material may be removed from above the horizontal plane including the top surface of the first insulating cap layer 170. A remaining portion of the dielectric fill material that fills the region overlying the first stepped surfaces constitutes a first stepped dielectric material portion 165. As used herein, a "stepped" element refers to an element that has stepped surfaces and a horizontal cross-sectional area that increases monotonically as a function of a vertical distance from a top surface of a substrate on which the element is present. The first-tier alternating stack (132, 142) and the first stepped dielectric material portion 165 collectively constitute a first-tier structure, which is an in-process structure that is subsequently modified.

An inter-tier dielectric layer 180 may be optionally deposited over the first-tier structure (132, 142, 170, 165). The inter-tier dielectric layer 180 includes a dielectric material such as silicon oxide. In one embodiment, the inter-tier dielectric layer 180 may include a doped silicate glass having a greater etch rate than the material of the first insulating layers 132 (which may include an undoped silicate glass). For example, the inter-tier dielectric layer 180 may include phosphosilicate glass. The thickness of the inter-tier dielectric layer 180 may be in a range from 30 nm to 300 nm, although lesser and greater thicknesses may also be used.

Figure 4A:
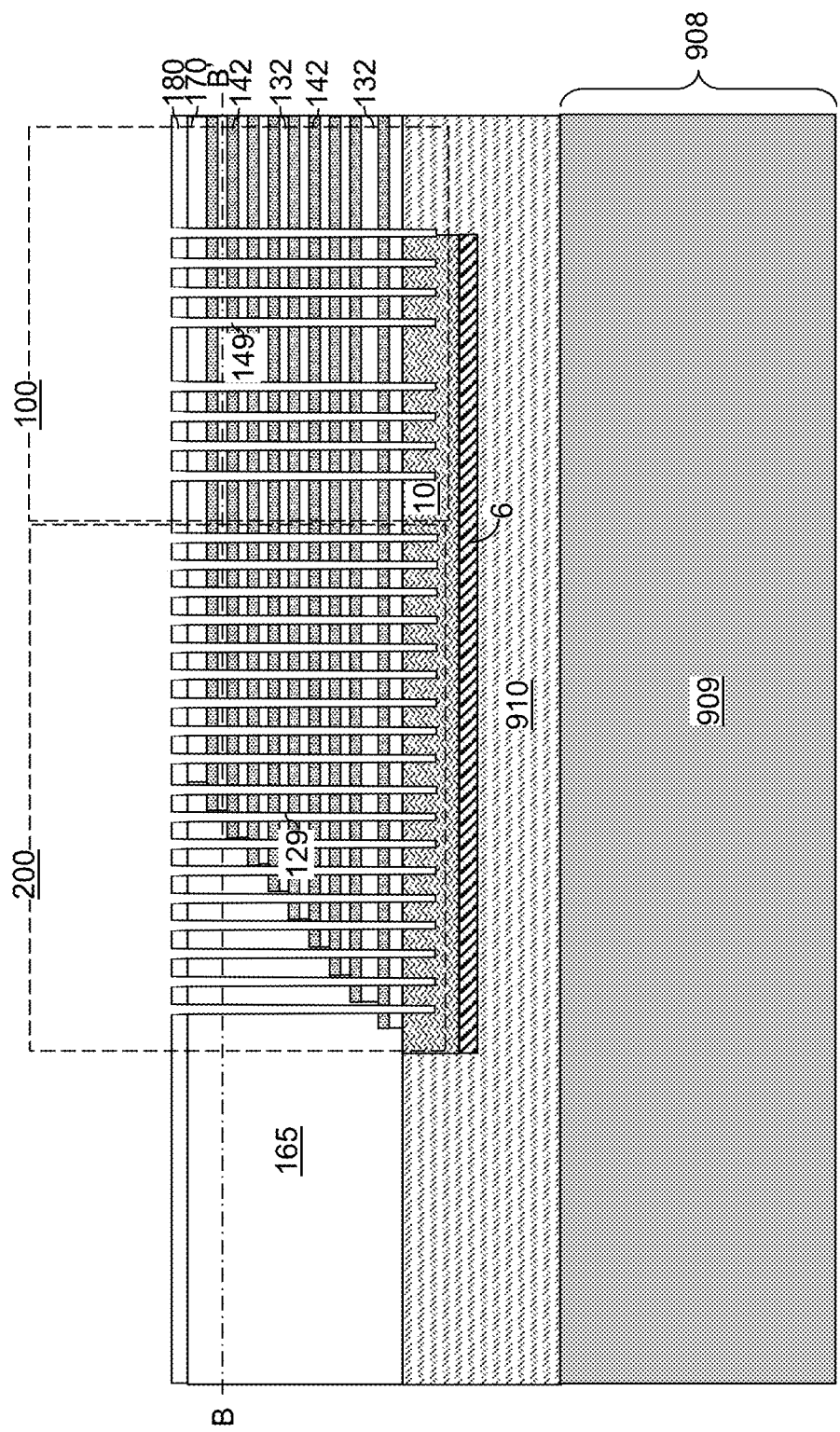
FIG. 4A is a vertical cross-sectional view of the exemplary structure after formation of first-tier memory openings and first-tier support openings according to the first embodiment of the present disclosure.
Figure 4B:
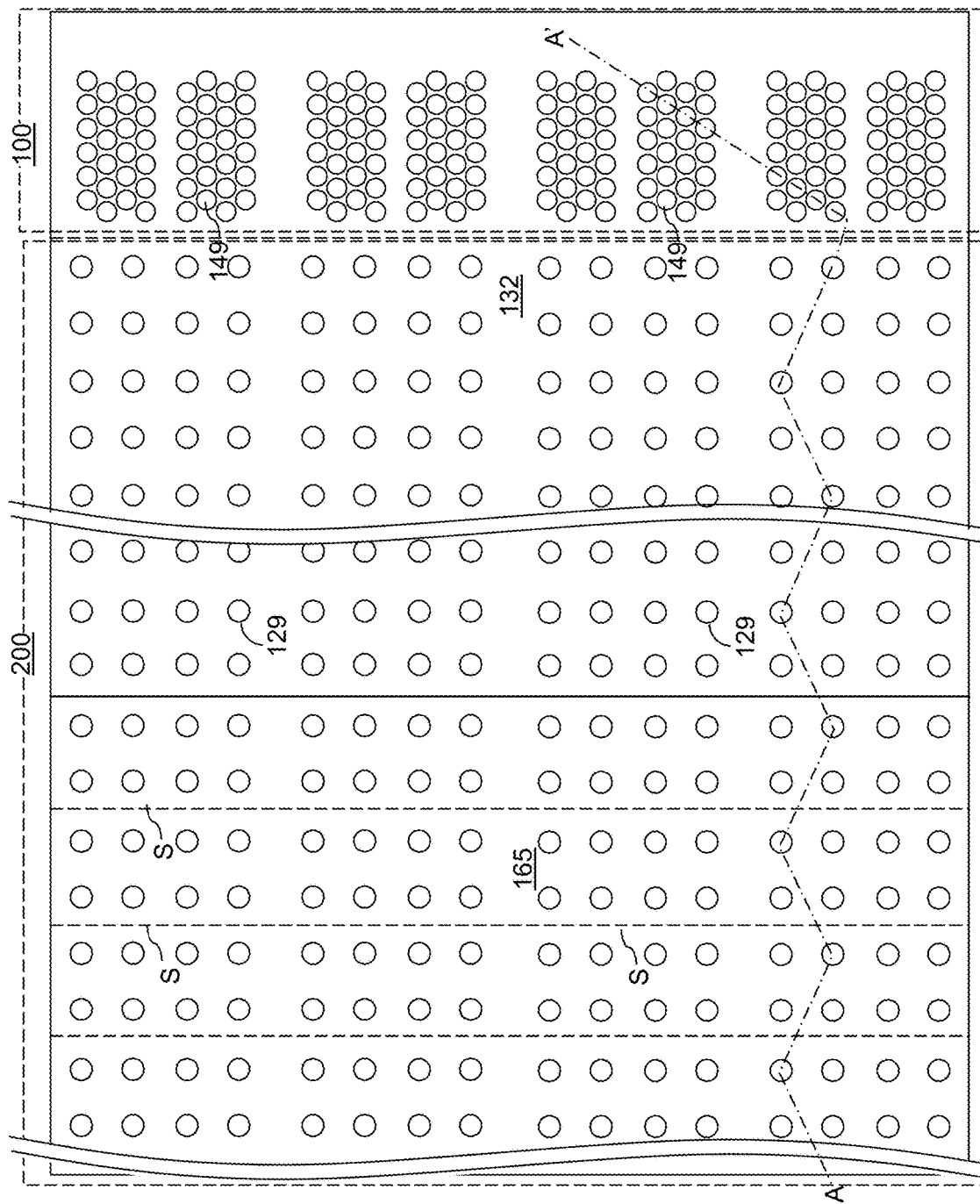
FIG. 4B is a horizontal cross-sectional view of the exemplary structure of FIG. 4A. The hinged vertical plane A-A' corresponds to the plane of the vertical cross-sectional view of FIG. 4A.

Referring to FIGS. 4A and 4B, various first-tier openings (149, 129) may be formed through the inter-tier dielectric layer 180 and the first-tier structure (132, 142, 170, 165) and into the source semiconductor layer 10. A photoresist layer (not shown) may be applied over the inter-tier dielectric layer 180, and may be lithographically patterned to form various openings therethrough. The pattern of openings in the photoresist layer may be transferred through the inter-tier dielectric layer 180 and the first-tier structure (132, 142, 170, 165) and into the source semiconductor layer 10 by a first anisotropic etch process to form the various first-tier openings (149, 129) concurrently, i.e., during the first isotropic etch process. The various first-tier openings (149, 129) may include first-tier memory openings 149 and first-tier support openings 129. Locations of steps S in the first alternating stack (132, 142) are illustrated as dotted lines in FIG. 4B.

The first-tier memory openings 149 are openings that are formed in the memory array region 100 through each layer within the first alternating stack (132, 142) and are subsequently used to form memory stack structures therein. The first-tier memory openings 149 may be formed in clusters of first-tier memory openings 149 that are laterally spaced apart along the second horizontal direction hd2. Each cluster of first-tier memory openings 149 may be formed as a two-dimensional array of first-tier memory openings 149.

The first-tier support openings 129 are openings that are formed in the staircase region 200. A subset of the first-tier support openings 129 that is formed through the first stepped dielectric material portion 165 may be formed through a respective horizontal surface of the first stepped surfaces.

In one embodiment, the first anisotropic etch process may include an initial step in which the materials of the first-tier alternating stack (132, 142) are etched concurrently with the material of the first stepped dielectric material portion 165. The chemistry of the initial etch step may alternate to optimize etching of the first and second materials in the first-tier alternating stack (132, 142) while providing a comparable average etch rate to the material of the first stepped dielectric material portion 165. The first anisotropic etch process may use, for example, a series of reactive ion etch processes or a single reaction etch process (e.g., $CF_4$/$O_2$/Ar etch). The sidewalls of the various first-tier openings (149, 129) may be substantially vertical, or may be tapered. In one embodiment, the terminal portion of the anisotropic etch process may include an overetch step that etches into an upper portion of the source semiconductor layer 10. The photoresist layer may be subsequently removed, for example, by ashing.

Optionally, the portions of the first-tier memory openings 149 and the first-tier support openings 129 at the level of the inter-tier dielectric layer 180 may be laterally expanded by an isotropic etch. In this case, the inter-tier dielectric layer 180 may comprise a dielectric material (such as borosilicate glass) having a greater etch rate than the first insulating layers 132 (that may include undoped silicate glass) in dilute hydrofluoric acid. An isotropic etch (such as a wet etch using HF) may be used to expand the lateral dimensions of the first-tier memory openings 149 at the level of the inter-tier dielectric layer 180. The portions of the first-tier memory openings 149 located at the level of the inter-tier dielectric layer 180 may be optionally widened to provide a larger landing pad for second-tier memory openings to be subsequently formed through a second-tier alternating stack (to be subsequently formed prior to formation of the second-tier memory openings).

Referring to FIG. 5, sacrificial first-tier opening fill portions (148, 128) may be formed in the various first-tier openings (149, 129). For example, a sacrificial first-tier fill material is deposited concurrently deposited in each of the first-tier openings (149, 129). The sacrificial first-tier fill material includes a material that may be subsequently removed selective to the materials of the first insulating layers 132 and the first sacrificial material layers 142.

In one embodiment, the sacrificial first-tier fill material may include a semiconductor material such as silicon (e.g., a-Si or polysilicon), a silicon-germanium alloy, germanium, a III-V compound semiconductor material, or a combination thereof. Optionally, a thin etch stop liner (such as a silicon oxide layer or a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In another embodiment, the sacrificial first-tier fill material may include a silicon oxide material having a higher etch rate than the materials of the first insulating layers 132, the first insulating cap layer 170, and the inter-tier dielectric layer 180. For example, the sacrificial first-tier fill material may include borosilicate glass or porous or non-porous organosilicate glass having an etch rate that is at least 100 times higher than the etch rate of densified TEOS oxide (i.e., a silicon oxide material formed by decomposition of tetraethylorthosilicate glass in a chemical vapor deposition process and subsequently densified in an anneal process) in a 100:1 dilute hydrofluoric acid. In this case, a thin etch stop liner (such as a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In yet another embodiment, the sacrificial first-tier fill material may include amorphous silicon or a carbon-containing material (such as amorphous carbon or diamond-like carbon) that may be subsequently removed by ashing, or a silicon-based polymer that may be subsequently removed selective to the materials of the first alternating stack (132, 142).

Portions of the deposited sacrificial material may be removed from above the topmost layer of the first-tier alternating stack (132, 142), such as from above the inter-tier dielectric layer 180. For example, the sacrificial first-tier fill material may be recessed to a top surface of the inter-tier dielectric layer 180 using a planarization process. The planarization process may include a recess etch, chemical mechanical planarization (CMP), or a combination thereof. The top surface of the inter-tier dielectric layer 180 may be used as an etch stop layer or a planarization stop layer.

Remaining portions of the sacrificial first-tier fill material comprise sacrificial first-tier opening fill portions (148, 128). Specifically, each remaining portion of the sacrificial material in a first-tier memory opening 149 constitutes a sacrificial first-tier memory opening fill portion 148. Each remaining portion of the sacrificial material in a first-tier support opening 129 constitutes a sacrificial first-tier support opening fill portion 128. The various sacrificial first-tier opening fill portions (148, 128) are concurrently formed, i.e., during a same set of processes including the deposition process that deposits the sacrificial first-tier fill material and the planarization process that removes the first-tier deposition process from above the first alternating stack (132, 142) (such as from above the top surface of the inter-tier dielectric layer 180). The top surfaces of the sacrificial first-tier opening fill portions (148, 128) may be coplanar with the top surface of the inter-tier dielectric layer 180. Each of the sacrificial first-tier opening fill portions (148, 128) may, or may not, include cavities therein.

Figure 6:
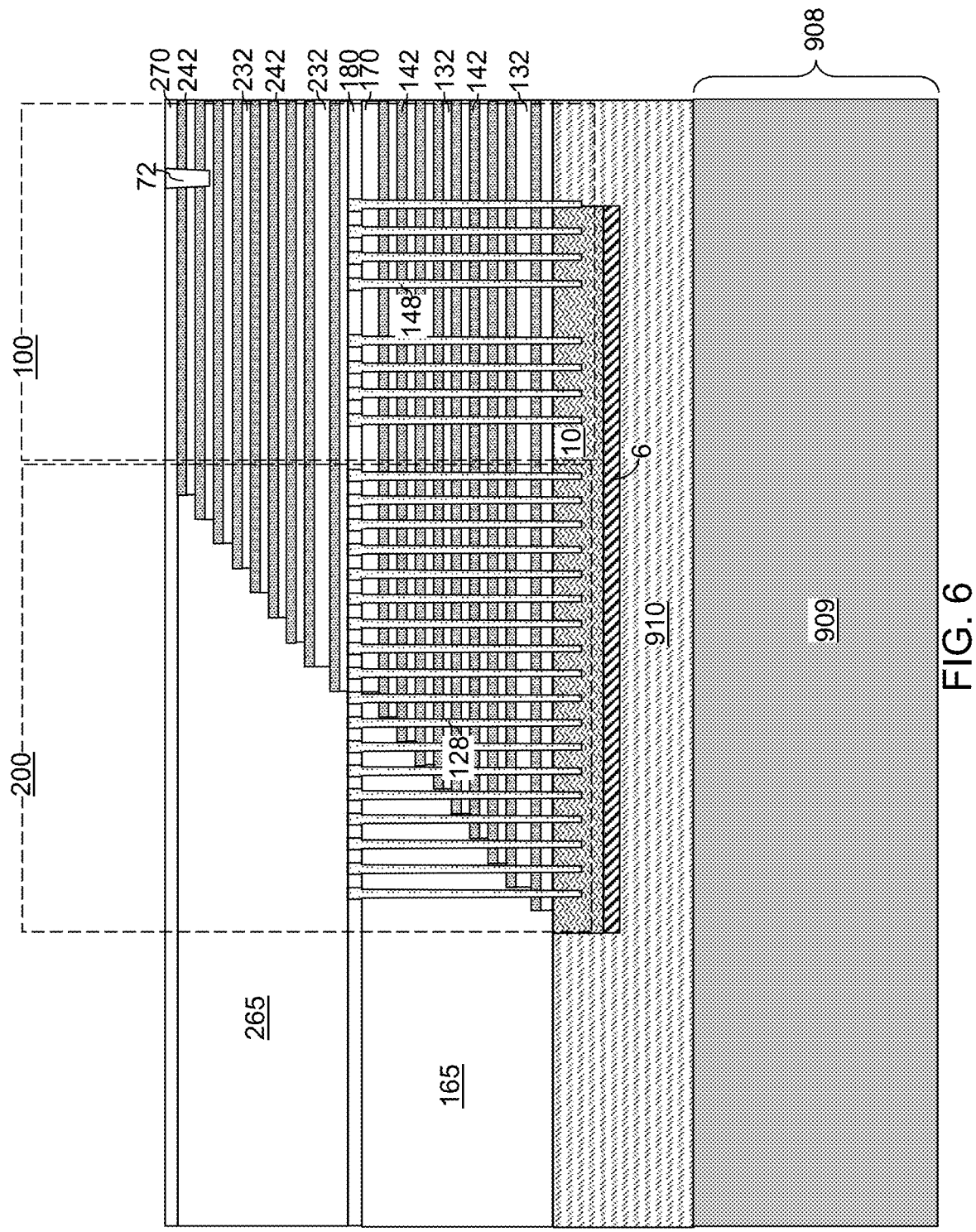
FIG. 6 is a vertical cross-sectional view of the exemplary structure after formation of a second-tier alternating stack of second insulating layers and second spacer material layers, second stepped surfaces, and a second stepped dielectric material portion according to the first embodiment of the present disclosure.

Referring to FIG. 6, a second-tier structure may be formed over the first-tier structure (132, 142, 170, 148). The second-tier structure may include an additional alternating stack of insulating layers and spacer material layers, which may be sacrificial material layers. For example, a second alternating stack (232, 242) of material layers may be subsequently formed on the top surface of the first alternating stack (132, 142). The second alternating stack (232, 242) may include an alternating plurality of third material layers and fourth material layers. Each third material layer may include a third material, and each fourth material layer may include a fourth material that is different from the third material. In one embodiment, the third material may be the same as the first material of the first insulating layer 132, and the fourth material may be the same as the second material of the first sacrificial material layers 142.

In one embodiment, the third material layers may be second insulating layers 232 and the fourth material layers may be second spacer material layers that provide vertical spacing between each vertically neighboring pair of the second insulating layers 232. In one embodiment, the third material layers and the fourth material layers may be second insulating layers 232 and second sacrificial material layers 242, respectively. The third material of the second insulating layers 232 may be at least one insulating material. The fourth material of the second sacrificial material layers 242 may be a sacrificial material that may be removed selective to the third material of the second insulating layers 232. The second sacrificial material layers 242 may comprise an insulating material, a semiconductor material, or a conductive material. The fourth material of the second sacrificial material layers 242 may be subsequently replaced with electrically conductive electrodes which may function, for example, as control gate electrodes of a vertical NAND device.

In one embodiment, each second insulating layer 232 may include a second insulating material, and each second sacrificial material layer 242 may include a second sacrificial material. In this case, the second alternating stack (232, 242) may include an alternating plurality of second insulating layers 232 and second sacrificial material layers 242. The third material of the second insulating layers 232 may be deposited, for example, by chemical vapor deposition (CVD). The fourth material of the second sacrificial material layers 242 may be formed, for example, CVD or atomic layer deposition (ALD).

The third material of the second insulating layers 232 may be at least one insulating material. Insulating materials that may be used for the second insulating layers 232 may be any material that may be used for the first insulating layers 132. The fourth material of the second sacrificial material layers 242 is a sacrificial material that may be removed selective to the third material of the second insulating layers 232. Sacrificial materials that may be used for the second sacrificial material layers 242 may be any material that may be used for the first sacrificial material layers 142. In one embodiment, the second insulating material may be the same as the first insulating material, and the second sacrificial material may be the same as the first sacrificial material.

The thicknesses of the second insulating layers 232 and the second sacrificial material layers 242 may be in a range from 20 nm to 50 nm, although lesser and greater thicknesses may be used for each second insulating layer 232 and for each second sacrificial material layer 242. The number of repetitions of the pairs of a second insulating layer 232 and a second sacrificial material layer 242 may be in a range from 2 to 1,024, and typically from 8 to 256, although a greater number of repetitions may also be used. In one embodiment, each second sacrificial material layer 242 in the second alternating stack (232, 242) may have a uniform thickness that is substantially invariant within each respective second sacrificial material layer 242.

Second stepped surfaces in the second stepped area may be formed in the staircase region 200 using a same set of processing steps as the processing steps used to form the first stepped surfaces in the first stepped area with suitable adjustment to the pattern of at least one masking layer. A second stepped dielectric material portion 265 may be formed over the second stepped surfaces in the staircase region 200.

A second insulating cap layer 270 may be subsequently formed over the second alternating stack (232, 242). The second insulating cap layer 270 includes a dielectric material that is different from the material of the second sacrificial material layers 242. In one embodiment, the second insulating cap layer 270 may include silicon oxide. In one embodiment, the first and second sacrificial material layers (142, 242) may comprise silicon nitride.

Generally speaking, at least one alternating stack of insulating layers (132, 232) and spacer material layers (such as sacrificial material layers (142, 242)) may be formed over the source semiconductor layer 10, and at least one stepped dielectric material portion (165, 265) may be formed over the staircase regions on the at least one alternating stack (132, 142, 232, 242).

Optionally, drain-select-level isolation structures 72 may be formed through a subset of layers in an upper portion of the second-tier alternating stack (232, 242). The second sacrificial material layers 242 that are cut by the drain-select-level isolation structures 72 correspond to the levels in which drain-select-level electrically conductive layers are subsequently formed. The drain-select-level isolation structures 72 include a dielectric material such as silicon oxide. The drain-select-level isolation structures 72 may laterally extend along a first horizontal direction hd1, and may be laterally spaced apart along a second horizontal direction hd2 that is perpendicular to the first horizontal direction hd1. The second alternating stack (232, 242), the second stepped dielectric material portion 265, the second insulating cap layer 270, and the optional drain-select-level isolation structures 72 collectively constitute a second-tier structure (232, 242, 265, 270, 72).

Figure 7A:
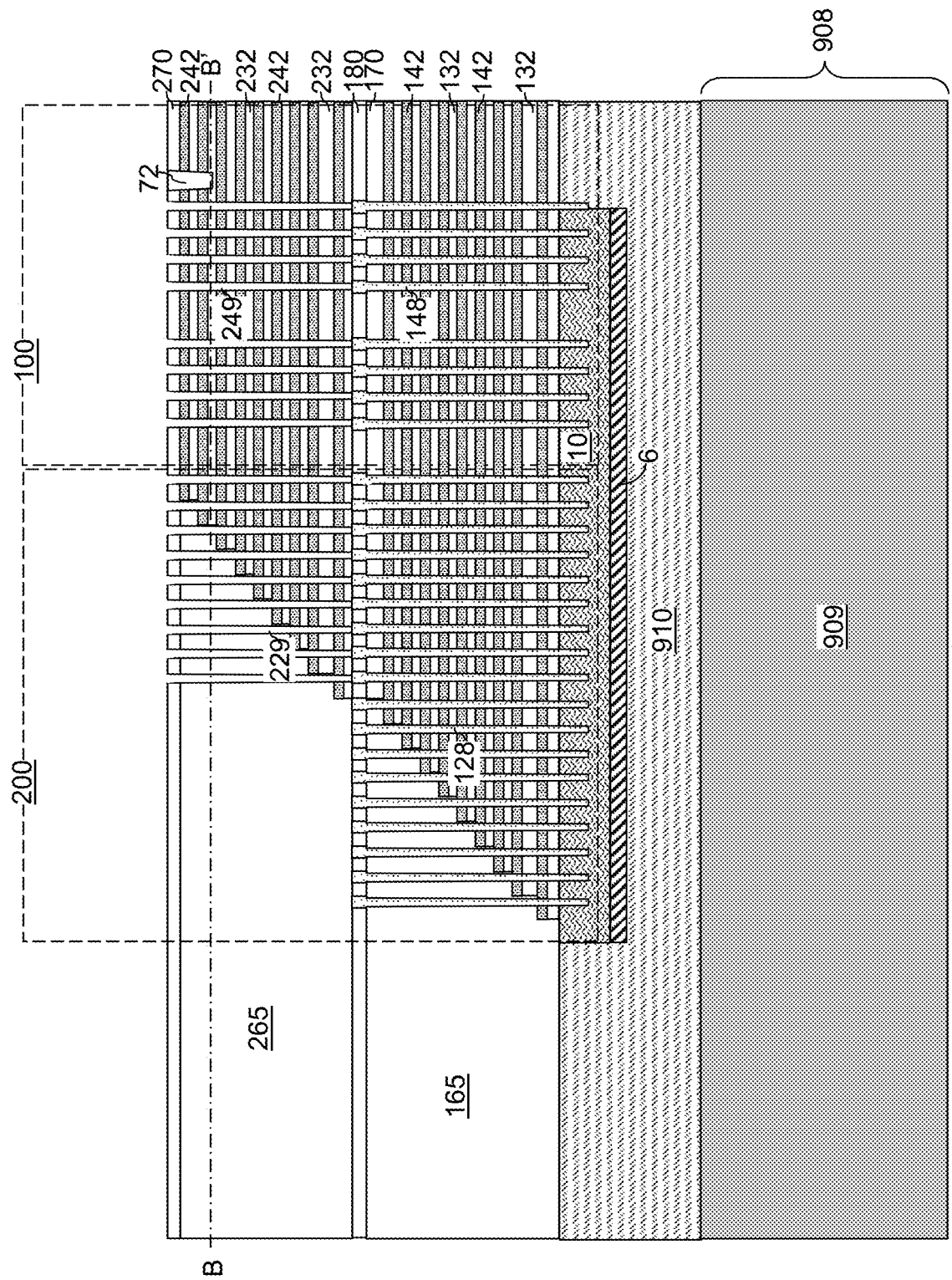
FIG. 7A is a vertical cross-sectional view of the exemplary structure after formation of second-tier memory openings and second-tier support openings according to the first embodiment of the present disclosure.
Figure 7B:
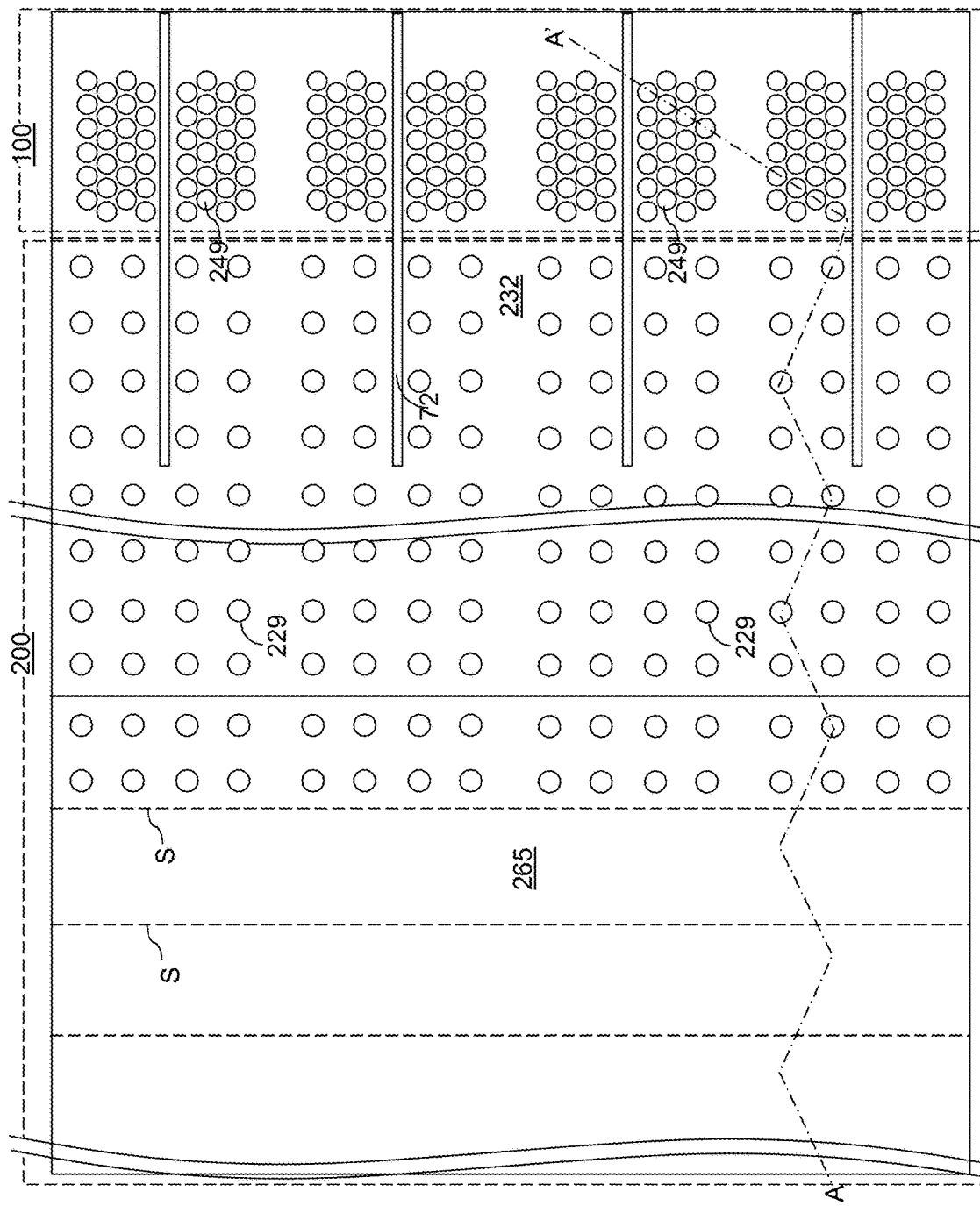
FIG. 7B is a horizontal cross-sectional of the exemplary structure along the horizontal plane B-B' of FIG. 7A. The hinged vertical plane A-A' corresponds to the plane of the vertical cross-sectional view of FIG. 7A.

Referring to FIGS. 7A and 7B, various second-tier openings (249, 229) may be formed through the second-tier structure (232, 242, 265, 270, 72). A photoresist layer (not shown) may be applied over the second insulating cap layer 270, and may be lithographically patterned to form various openings therethrough. The pattern of the second-tier memory openings 249 in the memory array region 100 may be the same as the pattern of the first-tier memory openings 149, which is the same as the pattern of the first-tier memory opening fill portion 148. In one embodiment, the lateral extent of the pattern of the second-tier support openings 229 in the staircase region 200 can be limited within the areas of the stepped surfaces of the second-tier alternating stack (232, 242). In other words, the second-tier support openings 229 may be absent within an area 69 in which the second retro-stepped dielectric material portion 265 contacts a top surface of the inter-stack dielectric layer 180. The area 69 will be etched in a subsequent step to form a recess, as will be described below. Thus, in one embodiment, the lithographic mask used to pattern the first-tier openings (149, 129) may different from the mask used to pattern the second tier openings (249, 229). In another embodiment, the lithographic mask used to pattern the first-tier openings (149, 129) may the same as the mask used to pattern the second tier openings (249, 229). In this embodiment, the second-tier support openings 229 may present within the area 69.

The pattern of openings in the photoresist layer may be transferred through the second-tier structure (232, 242, 265, 270, 72) by a second anisotropic etch process to form various second-tier openings (249, 229) concurrently, i.e., during the second anisotropic etch process. The various second-tier openings (249, 229) may include second-tier memory openings 249 and second-tier support openings 229.

The second-tier memory openings 249 are formed directly on a top surface of a respective one of the sacrificial first-tier memory opening fill portions 148. The second-tier support openings 229 are formed directly on a top surface of a respective one of the sacrificial first-tier support opening fill portions 128. Further, each second-tier support openings 229 may be formed through a horizontal surface within the second stepped surfaces, which include the interfacial surfaces between the second alternating stack (232, 242) and the second stepped dielectric material portion 265. Locations of steps S in the first-tier alternating stack (132, 142) and the second-tier alternating stack (232, 242) are illustrated as dotted lines in FIG. 7B.

The second anisotropic etch process may include an etch step in which the materials of the second-tier alternating stack (232, 242) are etched concurrently with the material of the second stepped dielectric material portion 265. The chemistry of the etch step may alternate to optimize etching of the materials in the second-tier alternating stack (232, 242) while providing a comparable average etch rate to the material of the second stepped dielectric material portion 265. The second anisotropic etch process may use, for example, a series of reactive ion etch processes or a single reaction etch process (e.g., $CF_4/O_2/Ar$ etch). The sidewalls of the various second-tier openings (249, 229) may be substantially vertical, or may be tapered. A bottom periphery of each second-tier opening (249, 229) may be laterally offset, and/or may be located entirely within, a periphery of a top surface of an underlying sacrificial first-tier opening fill portion (148, 128). The photoresist layer may be subsequently removed, for example, by ashing.

Figure 8:
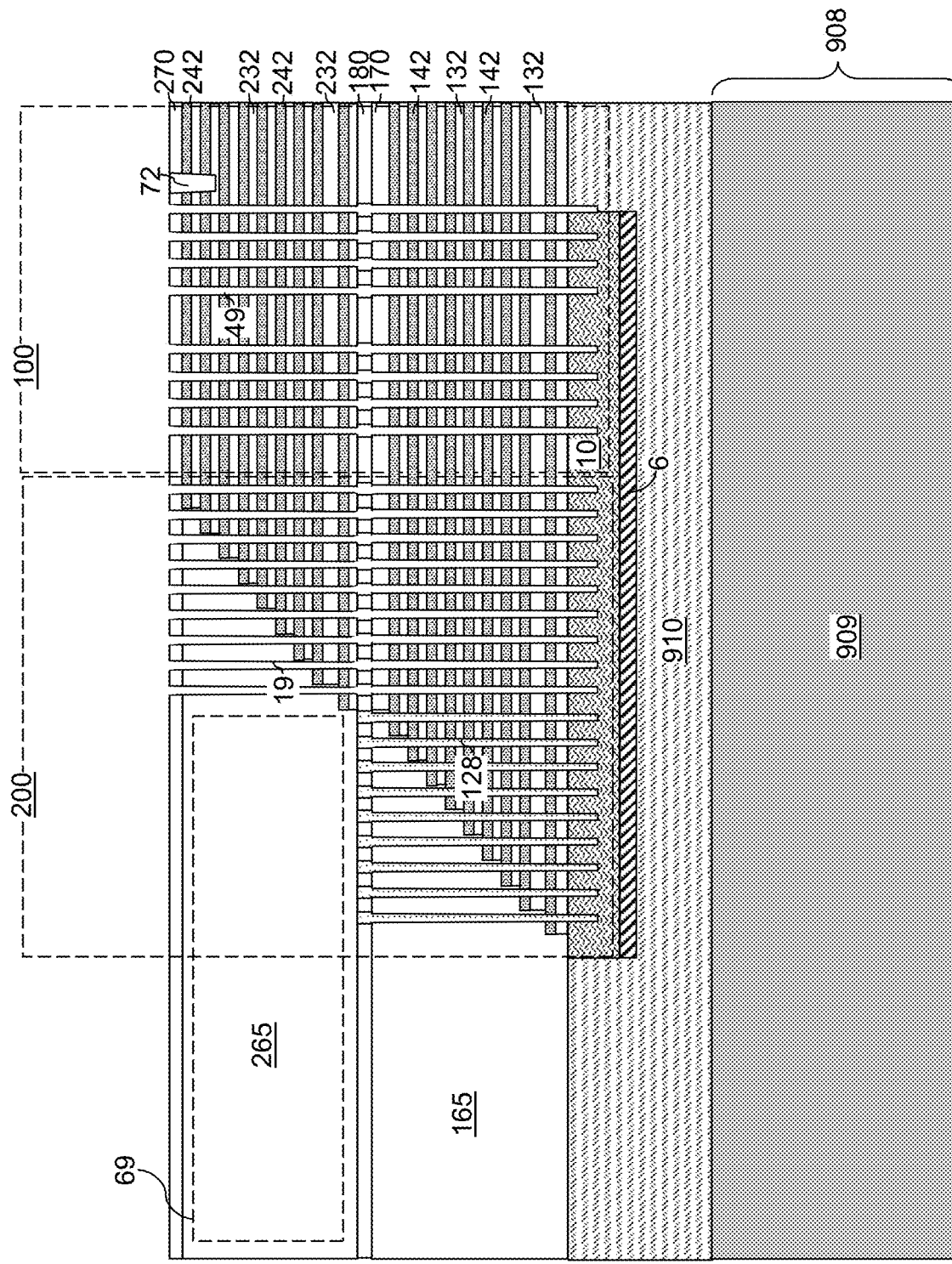
FIG. 8 is a vertical cross-sectional view of the exemplary structure after formation of inter-tier memory openings and inter-tier support openings according to the first embodiment of the present disclosure.

Referring to FIG. 8, the sacrificial first-tier fill material of the sacrificial first-tier opening fill portions (148, 128) may be removed using an etch process that etches the sacrificial first-tier fill material selective to the materials of the first and second insulating layers (132, 232), the first and second sacrificial material layers (142, 242), the first and second insulating cap layers (170, 270), and the inter-tier dielectric layer 180. A memory opening 49, which is also referred to as an inter-tier memory opening 49, is formed in each combination of a second-tier memory openings 249 and a volume from which a sacrificial first-tier memory opening fill portion 148 is removed. A support opening 19, which is also referred to as an inter-tier support opening 19, is formed in each combination of a second-tier support openings 229 and a volume from which a sacrificial first-tier support opening fill portion 128 is removed. In one configuration, if the sacrificial first-tier support opening fill portion 128 comprise an insulating material, and if the second-tier support openings 229 are not present in area 69, then the sacrificial first-tier support opening fill portions 128 located under area 65 are not removed and remain in the final device, as shown in FIG. 8. In an alternative configuration, if the second-tier support openings 229 are present in area 69, then the sacrificial first-tier support opening fill portions 128 located under area 65 are also removed (i.e., all of the sacrificial first-tier support opening fill portions 128 in the device are removed).

FIGS. 9A-9D provide sequential cross-sectional views of a memory opening 49 during formation of a memory opening fill structure. The same structural change occurs in each of the memory openings 49 and the support openings 19.

Referring to FIG. 9A, a pedestal channel portion 11 may be formed by a selective semiconductor material deposition process at the bottom of each memory opening 49 and at the bottom of each support opening 19. A doped semiconductor material having a doping of a first conductivity type may be selectively grown from the physically exposed surfaces of the source semiconductor layer 10, while growth of the doped semiconductor material from dielectric surfaces is suppressed during the selective semiconductor material deposition process. A semiconductor precursor gas, a dopant gas including dopants atoms of the first conductivity type, and an etchant may be flowed into a process chamber including the exemplary structure concurrently or alternately. A periphery of a top surface each pedestal channel portion 11 may contact a sidewall of a first insulating layer 132 that overlies, and contacts, a bottommost first sacrificial material layer 142. The atomic concentration of first conductivity type dopants in the pedestal channel portions 11 may be in a range from $1.0 \times 10^{14}/cm^3$ to $1.0 \times 10^{18}/cm^3$, although lesser and greater dopant atomic concentrations may also be used. A p-n junction may be formed at each interface between the source semiconductor layer 10 and the pedestal channel portions 11.

Referring to FIG. 9B, a stack of layers including a blocking dielectric layer 52, a charge storage layer 54, a tunneling dielectric layer 56, and a semiconductor channel material layer 60L may be sequentially deposited in the memory openings 49. The blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the blocking dielectric layer 52 includes aluminum oxide. Alternatively or additionally, the blocking dielectric layer 52 may include a dielectric semiconductor compound such as silicon oxide, silicon oxynitride, silicon nitride, or a combination thereof.

Subsequently, the charge storage layer 54 may be formed. In one embodiment, the charge storage layer 54 may be a continuous layer or patterned discrete portions of a charge trapping material including a dielectric charge trapping material, which may be, for example, silicon nitride. Alternatively, the charge storage layer 54 may include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) may have vertically coincident sidewalls, and the charge storage layer 54 may be formed as a single continuous layer. Alternatively, the sacrificial material layers (142, 242) may be laterally recessed with respect to the sidewalls of the insulating layers (132, 232), and a combination of a deposition process and an anisotropic etch process may be used to form the charge storage layer 54 as a plurality of memory material portions that are vertically spaced apart. The thickness of the charge storage layer 54 may be in a range from 2 nm to 20 nm, although lesser and greater thicknesses may also be used.

The tunneling dielectric layer 56 includes a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be used. The stack of the blocking dielectric layer 52, the charge storage layer 54, and the tunneling dielectric layer 56 constitutes a memory film 50 that stores memory bits.

The semiconductor channel material layer 60L includes a p-doped semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L may have a uniform doping. In one embodiment, the semiconductor channel material layer 60L has a p-type doping in which p-type dopants (such as boron atoms) are present at an atomic concentration in a range from $1.0 \times 10^{12}/cm^3$ to $1.0 \times 10^{18}/cm^3$, such as from $1.0 \times 10^{14}/cm^3$ to $1.0 \times 10^{17}/cm^3$. In one embodiment, the semiconductor channel material layer 60L includes, and/or consists essentially of, boron-doped amorphous silicon or boron-doped polysilicon. In another embodiment, the semiconductor channel material layer 60L has an n-type doping in which n-type dopants (such as phosphor atoms or arsenic atoms) are present at an atomic concentration in a range from $1.0 \times 10^{15}/cm^3$ to $1.0 \times 10^{19}/cm^3$, such as from $1.0 \times 10^{16}/cm^3$ to $1.0 \times 10^{18}/cm^3$. The semiconductor channel material layer 60L may be formed by a conformal deposition method such as low pressure chemical vapor deposition (LPCVD). The thickness of the semiconductor channel material layer 60L may be in a range from 2 nm to 10 nm, although lesser and greater thicknesses may also be used. A cavity 49' is formed in the volume of each memory opening 49 that is not filled with the deposited material layers (52, 54, 56, 60L).

Figure 9D:
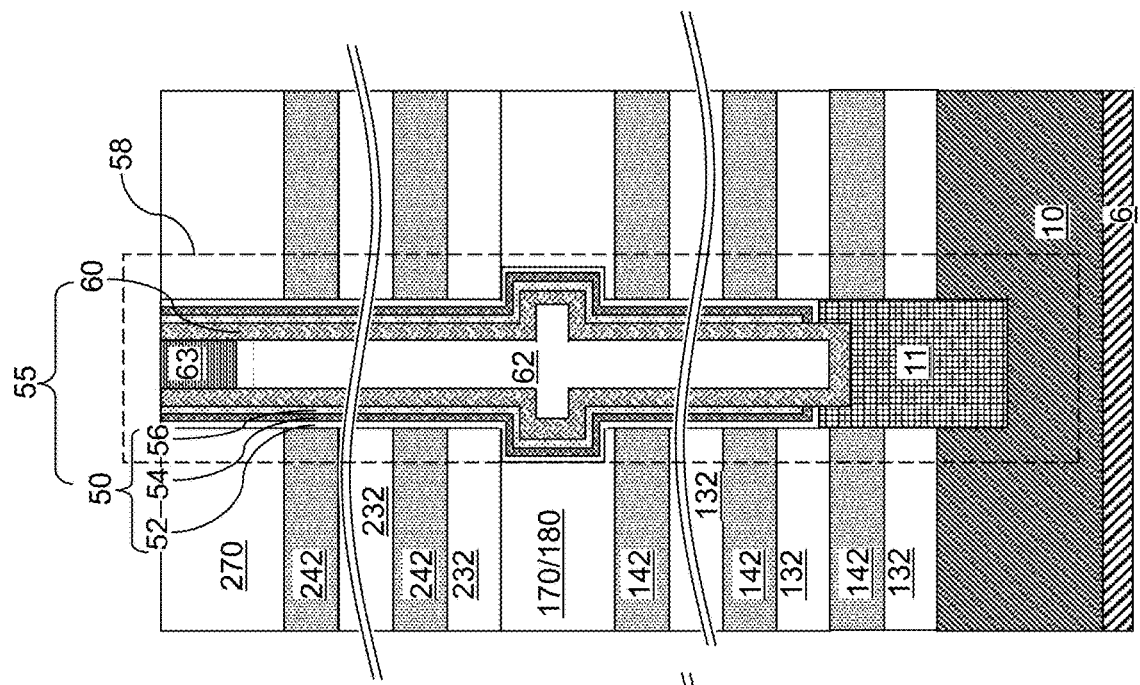
Figure 9C:
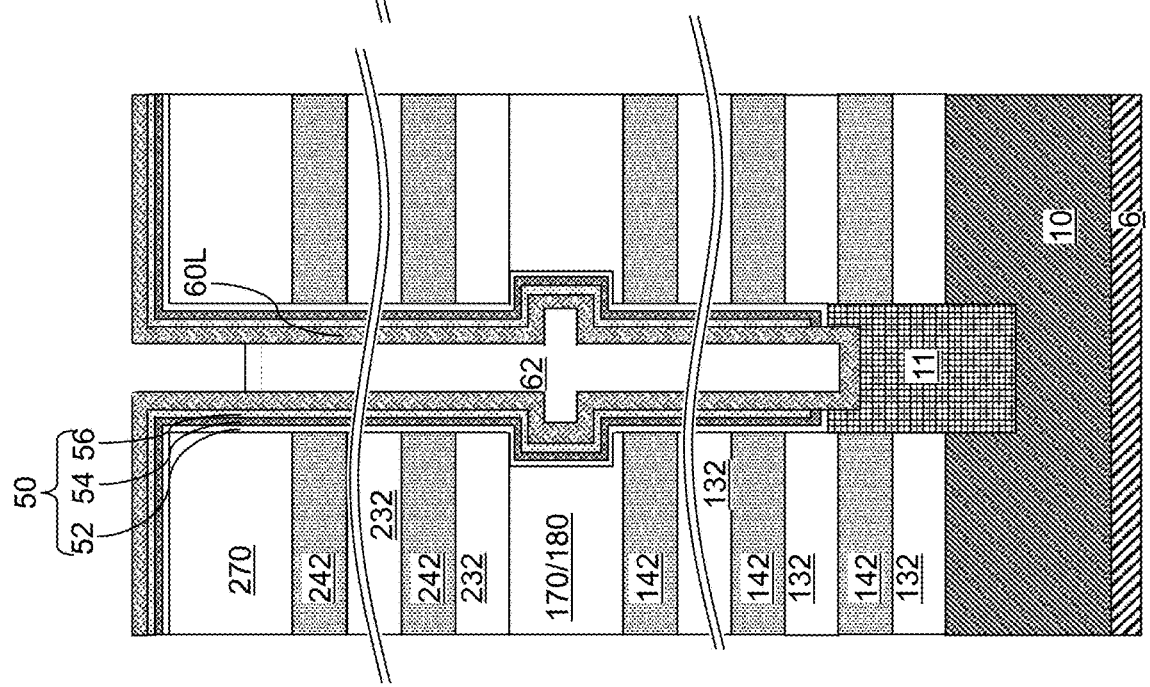

Referring to FIG. 9C, in case the cavity 49' in each memory opening is not completely filled by the semiconductor channel material layer 60L, a dielectric core layer may be deposited in the cavity 49' to fill any remaining portion of the cavity 49' within each memory opening. The dielectric core layer includes a dielectric material such as silicon oxide or organosilicate glass. The dielectric core layer may be deposited by a conformal deposition method such as low pressure chemical vapor deposition (LPCVD), or by a self-planarizing deposition process such as spin coating. The horizontal portion of the dielectric core layer overlying the second insulating cap layer 270 may be removed, for example, by a recess etch. The recess etch continues until top surfaces of the remaining portions of the dielectric core layer are recessed to a height between the top surface of the second insulating cap layer 270 and the bottom surface of the second insulating cap layer 270. Each remaining portion of the dielectric core layer constitutes a dielectric core 62.

Referring to FIG. 9D, a doped semiconductor material may be deposited in cavities overlying the dielectric cores 62. The doped semiconductor material has a doping of the opposite conductivity type of the doping of the semiconductor channel material layer 60L. Thus, the doped semiconductor material has an n-type doping. Portions of the deposited doped semiconductor material, the semiconductor channel material layer 60L, the tunneling dielectric layer 56, the charge storage layer 54, and the blocking dielectric layer 52 that overlie the horizontal plane including the top surface of the second insulating cap layer 270 may be removed by a planarization process such as a chemical mechanical planarization (CMP) process.

Each remaining portion of the n-doped semiconductor material constitutes a drain region 63. The dopant concentration in the drain regions 63 may be in a range from $5.0 \times 10^{19}/cm^3$ to $2.0 \times 10^{21}/cm^3$, although lesser and greater dopant concentrations may also be used. The doped semiconductor material may be, for example, doped polysilicon.

Each remaining portion of the semiconductor channel material layer 60L constitutes a vertical semiconductor channel 60 through which electrical current may flow when a vertical NAND device including the vertical semiconductor channel 60 is turned on. A tunneling dielectric layer 56 is surrounded by a charge storage layer 54, and laterally surrounds a vertical semiconductor channel 60. Each adjoining set of a blocking dielectric layer 52, a charge storage layer 54, and a tunneling dielectric layer 56 collectively constitute a memory film 50, which may store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 (which is a vertical semiconductor channel) within a memory opening 49 constitutes a memory stack structure 55. The memory stack structure 55 is a combination of a vertical semiconductor channel 60, a tunneling dielectric layer 56, a plurality of memory elements comprising portions of the charge storage layer 54, and an optional blocking dielectric layer 52. Each combination of a memory stack structure 55, a dielectric core 62, and a drain region 63 within a memory opening 49 constitutes a memory opening fill structure 58. The source semiconductor layer 10, the first-tier structure (132, 142, 170, 165), the second-tier structure (232, 242, 270, 265, 72), the inter-tier dielectric layer 180, and the memory opening fill structures 58 collectively constitute a memory-level assembly.

Figure 10:
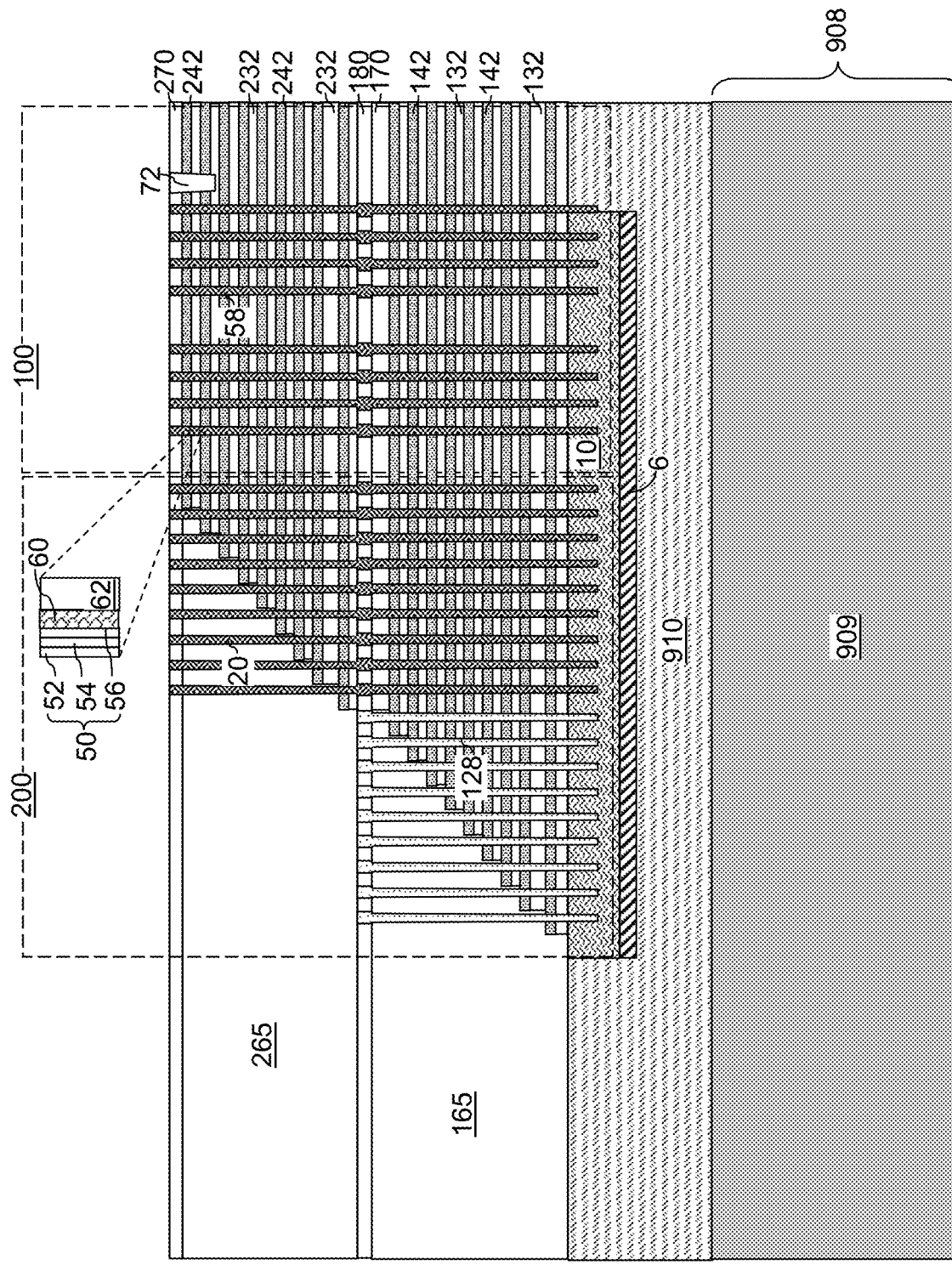
FIG. 10 is a vertical cross-sectional view of the exemplary structure after formation of memory opening fill structures and support pillar structures according to the first embodiment of the present disclosure.

Referring to FIG. 10, the exemplary structure is illustrated after formation of the memory opening fill structures 58. Support pillar structures 20 are formed in the support openings 19 concurrently with formation of the memory opening fill structures 58. Each support pillar structure 20 may have a same set of components as a memory opening fill structure 58.

Figure 11A:
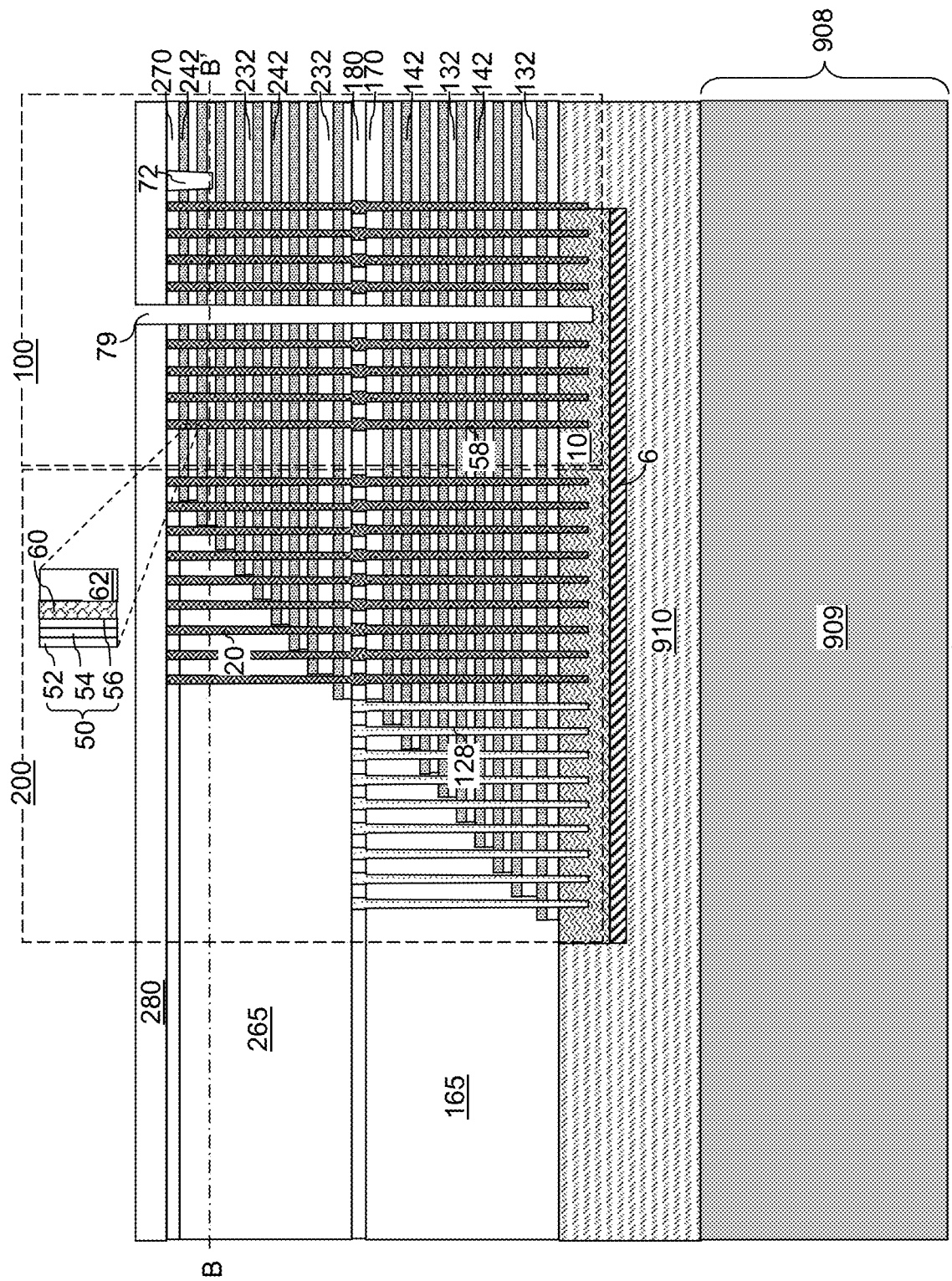
FIG. 11A is a vertical cross-sectional view of the exemplary structure after formation of a contact-level dielectric layer and backside trenches according to the first embodiment of the present disclosure.

Referring to FIGS. 11A and 11B, a contact-level dielectric layer 280 may be formed over the second-tier structure (232, 242, 270, 265, 72). The contact-level dielectric layer 280 includes a dielectric material such as silicon oxide, and may be formed by a conformal or non-conformal deposition process. For example, the contact-level dielectric layer 280 may include undoped silicate glass and may have a thickness in a range from 100 nm to 600 nm, although lesser and greater thicknesses may also be used.

A photoresist layer (not shown) may be applied over the contact-level dielectric layer 280 and may be lithographically patterned to form elongated openings that extend along the first horizontal direction hd1 between clusters of memory opening fill structures 58. Backside trenches 79 may be formed by transferring the pattern in the photoresist layer through the contact-level dielectric layer 280, the second-tier structure (232, 242, 270, 265, 72), and the first-tier structure (132, 142, 170, 165), and into the source semiconductor layer 10. Portions of the contact-level dielectric layer 280, the second-tier structure (232, 242, 270, 265, 72), the first-tier structure (132, 142, 170, 165), and the source semiconductor layer 10 that underlie the openings in the photoresist layer may be removed to form the backside trenches 79. In one embodiment, the backside trenches 79 may be formed between clusters of memory stack structures 55. The clusters of the memory stack structures 55 may be laterally spaced apart along the second horizontal direction hd2 by the backside trenches 79. While it is desirable for the backside trenches 79 to be formed with completely straight sidewalls, the backside trenches 79 are often formed with local width variations with non-straight surfaces due to various effects including local variations of process parameters (such as local variations in gas flow, pressure, electrical field, etc.) and charge density variations within the exemplary structure due to local layout variations of conductive components within the exemplary structure.

Figure 12:
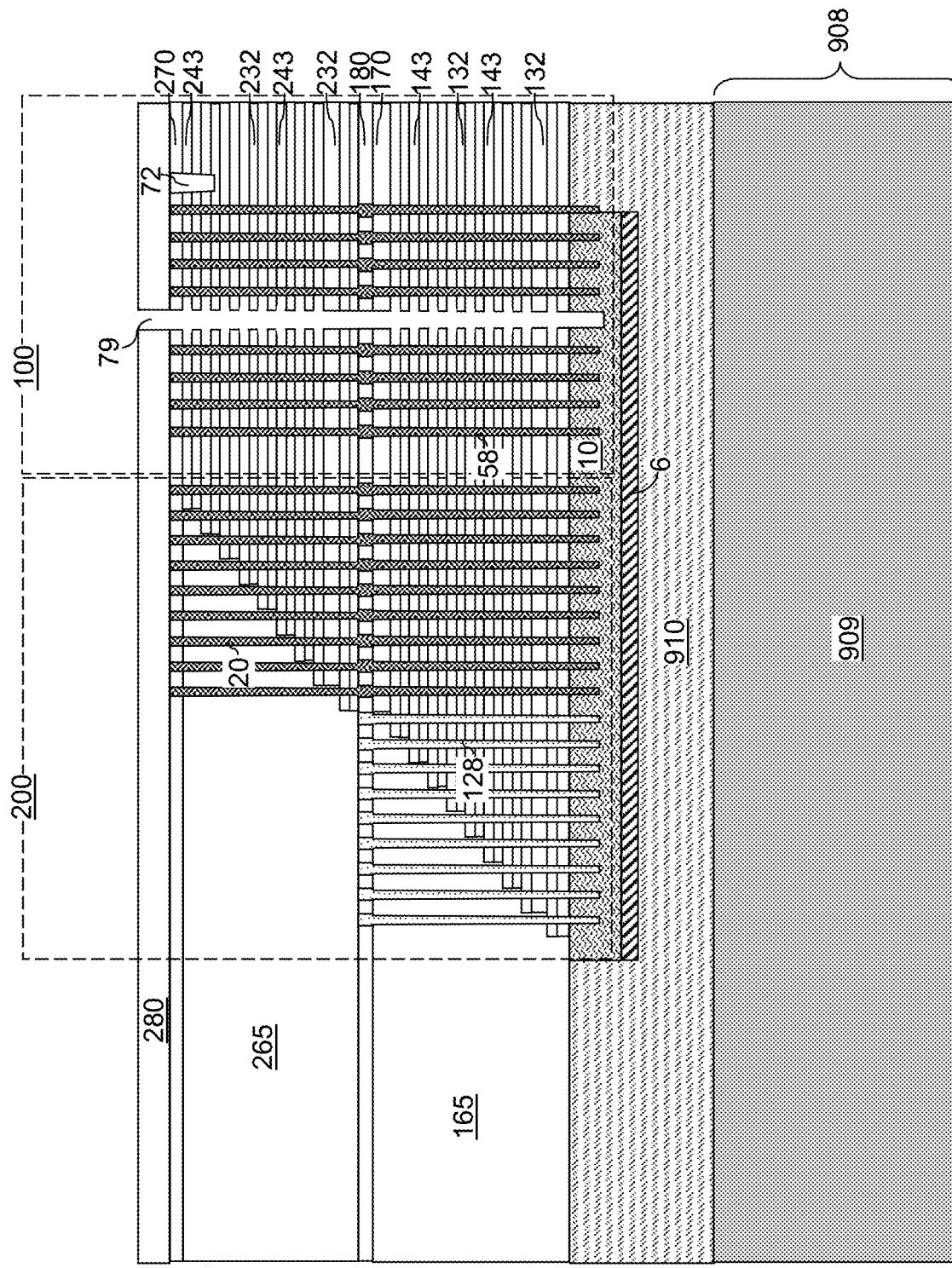
FIG. 12 is a vertical cross-sectional view of the exemplary structure after formation of backside recesses according to the first embodiment of the present disclosure.

Referring to FIG. 12, the sacrificial material layers (142, 242) are may be removed selective to the insulating layers (132, 232), the first and second insulating cap layers (170, 270), the contact-level dielectric layer 280, and the source semiconductor layer 10. For example, an etchant that selectively etches the materials of the sacrificial material layers (142, 242) with respect to the materials of the insulating layers (132, 232), the first and second insulating cap layers (170, 270), the stepped dielectric material portions (165, 265), and the material of the outermost layer of the memory films 50 may be introduced into the backside trenches 79, for example, using an isotropic etch process. For example, the sacrificial material layers (142, 242) may include silicon nitride, the materials of the insulating layers (132, 232), the first and second insulating cap layers (170, 270), the stepped dielectric material portions (165, 265), and the outermost layer of the memory films 50 may include silicon oxide materials.

The isotropic etch process may be a wet etch process using a wet etch solution, or may be a gas phase (dry) etch process in which the etchant is introduced in a vapor phase into the backside trench 79. For example, if the sacrificial material layers (142, 242) include silicon nitride, the etch process may be a wet etch process in which the exemplary structure is immersed within a wet etch tank including phosphoric acid, which etches silicon nitride selective to silicon oxide, silicon, and various other materials used in the art.

Backside recesses (143, 243) are formed in volumes from which the sacrificial material layers (142, 242) are removed. The backside recesses (143, 243) include first backside recesses 143 that are formed in volumes from which the first sacrificial material layers 142 are removed and second backside recesses 243 that are formed in volumes from which the second sacrificial material layers 242 are removed. Each of the backside recesses (143, 243) may be a laterally extending cavity having a lateral dimension that is greater than the vertical extent of the cavity. In other words, the lateral dimension of each of the backside recesses (143, 243) may be greater than the height of the respective backside recess (143, 243). A plurality of backside recesses (143, 243) may be formed in the volumes from which the material of the sacrificial material layers (142, 242) is removed. Each of the backside recesses (143, 243) may extend substantially parallel to the top surface of the semiconductor substrate layer 909. A backside recess (143, 243) may be vertically bounded by a top surface of an underlying insulating layer (132, 232) and a bottom surface of an overlying insulating layer (132, 232). In one embodiment, each of the backside recesses (143, 243) may have a uniform height throughout.

Figure 13A:
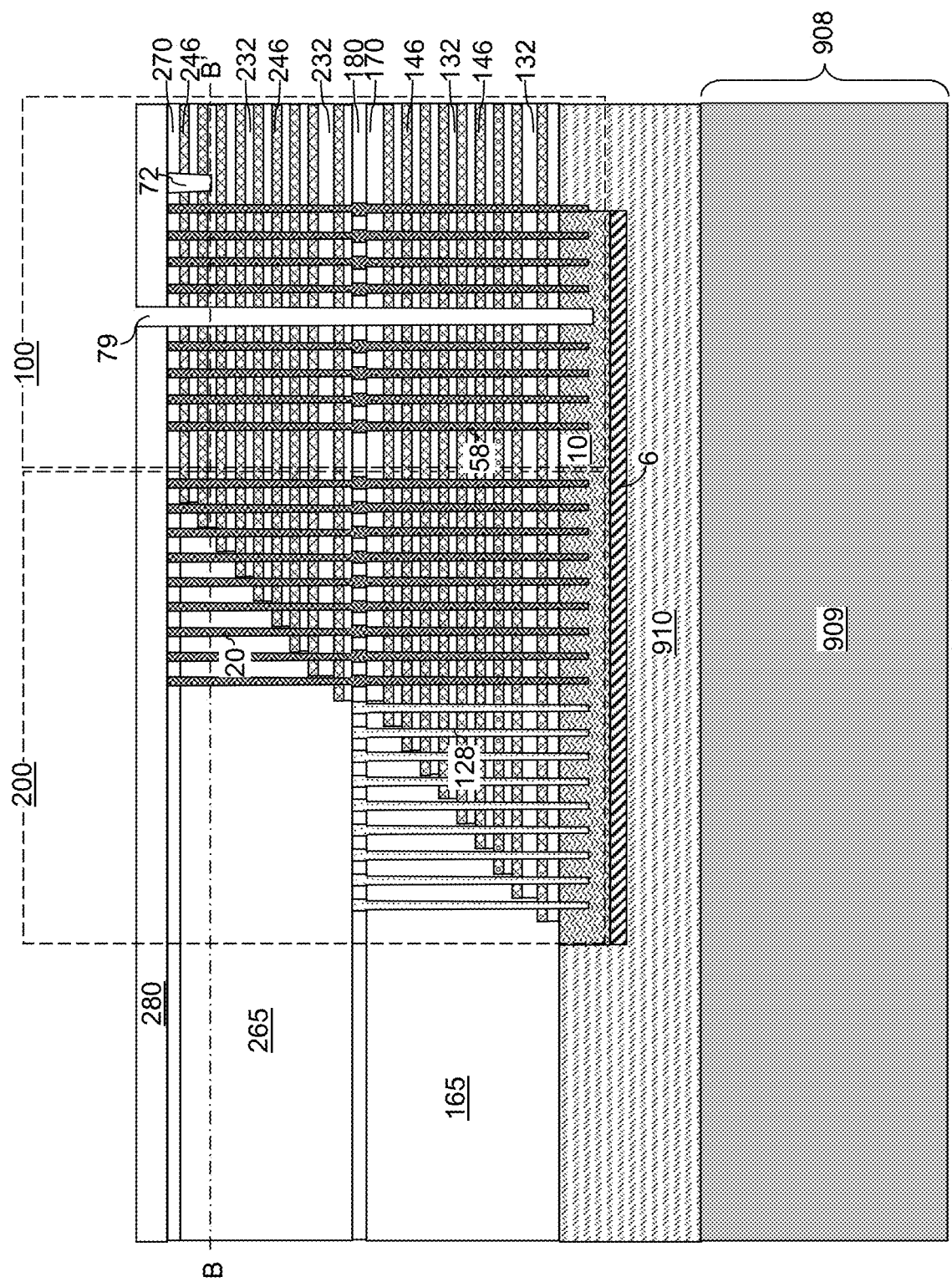
FIG. 13A is a vertical cross-sectional view of the exemplary structure after formation of electrically conductive layers according to the first embodiment of the present disclosure.

Referring to FIGS. 13A and 13B, an oxidation process may be performed to oxidize physically exposed portions of the pedestal channel portions 11. Tubular insulating spacers (not expressly illustrated) may be formed around each pedestal channel portion 11. A backside blocking dielectric layer (not shown) may be optionally deposited in the backside recesses (143, 243) and the backside trenches 79 and over the contact-level dielectric layer 280. The backside blocking dielectric layer includes a dielectric material such as a dielectric metal oxide, silicon oxide, or a combination thereof. For example, the backside blocking dielectric layer may include aluminum oxide. The backside blocking dielectric layer may be formed by a conformal deposition process such as atomic layer deposition or chemical vapor deposition. The thickness of the backside blocking dielectric layer may be in a range from 1 nm to 20 nm, such as from 2 nm to 10 nm, although lesser and greater thicknesses may also be used.

At least one conductive material may be deposited in the plurality of backside recesses (243, 243), on the sidewalls of the backside trenches 79, and over the contact-level dielectric layer 280. The at least one conductive material may be deposited by a conformal deposition method, which may be, for example, chemical vapor deposition (CVD), atomic layer deposition (ALD), electroless plating, electroplating, or a combination thereof. The at least one conductive material may include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material may include at least one metallic material, i.e., an electrically conductive material that includes at least one metallic element. Non-limiting exemplary metallic materials that may be deposited in the backside recesses (143, 243) include tungsten, tungsten nitride, titanium, titanium nitride, tantalum, tantalum nitride, cobalt, and ruthenium. For example, the at least one conductive material may include a conductive metallic nitride liner that includes a conductive metallic nitride material such as TiN, TaN, WN, or a combination thereof, and a conductive fill material such as W, Co, Ru, Mo, Cu, or combinations thereof. In one embodiment, the at least one conductive material for filling the backside recesses (143, 243) may be a combination of titanium nitride layer and a tungsten fill material.

Electrically conductive layers (146, 246) may be formed in the backside recesses (143, 243) by deposition of the at least one conductive material. A plurality of first electrically conductive layers 146 may be formed in the plurality of first backside recesses 143, a plurality of second electrically conductive layers 246 may be formed in the plurality of second backside recesses 243, and a continuous metallic material layer (not shown) may be formed on the sidewalls of each backside trench 79 and over the contact-level dielectric layer 280. Each of the first electrically conductive layers 146 and the second electrically conductive layers 246 may include a respective conductive metallic nitride liner and a respective conductive fill material. Thus, the first and second sacrificial material layers (142, 242) may be replaced with the first and second electrically conductive layers (146, 246), respectively. Specifically, each first sacrificial material layer 142 may be replaced with an optional portion of the backside blocking dielectric layer and a first electrically conductive layer 146, and each second sacrificial material layer 242 may be replaced with an optional portion of the backside blocking dielectric layer and a second electrically conductive layer 246. A backside cavity is present in the portion of each backside trench 79 that is not filled with the continuous metallic material layer.

Residual conductive material may be removed from inside the backside trenches 79. Specifically, the deposited metallic material of the continuous metallic material layer may be etched back from the sidewalls of each backside trench 79 and from above the contact-level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Sidewalls of the first electrically conductive material layers 146 and the second electrically conductive layers may be physically exposed to a respective backside trench 79. The backside trenches may have a pair of curved sidewalls having a non-periodic width variation along the first horizontal direction hd1 and a non-linear width variation along the vertical direction.

Each electrically conductive layer (146, 246) may be a conductive sheet including openings therein. A first subset of the openings through each electrically conductive layer (146, 246) may be filled with memory opening fill structures 58. A second subset of the openings through each electrically conductive layer (146, 246) may be filled with the support pillar structures 20. Each electrically conductive layer (146, 246) may have a lesser area than any underlying electrically conductive layer (146, 246) because of the first and second stepped surfaces. Each electrically conductive layer (146, 246) may have a greater area than any overlying electrically conductive layer (146, 246) because of the first and second stepped surfaces.

In some embodiment, drain-select-level isolation structures 72 may be provided at topmost levels of the second electrically conductive layers 246. A subset of the second electrically conductive layers 246 located at the levels of the drain-select-level isolation structures 72 constitutes drain select gate electrodes. A subset of the electrically conductive layer (146, 246) located underneath the drain select gate electrodes may function as combinations of a control gate and a word line located at the same level. The control gate electrodes within each electrically conductive layer (146, 246) are the control gate electrodes for a vertical memory device including the memory stack structure 55.

Each of the memory stack structures 55 comprises a vertical stack of memory elements located at each level of the electrically conductive layers (146, 246). A subset of the electrically conductive layers (146, 246) may comprise word lines for the memory elements. The memory-level assembly is located over the semiconductor substrate layer 909. The memory-level assembly includes at least one alternating stack (132, 146, 232, 246) and memory stack structures 55 vertically extending through the at least one alternating stack (132, 146, 232, 246).

Figure 14A:
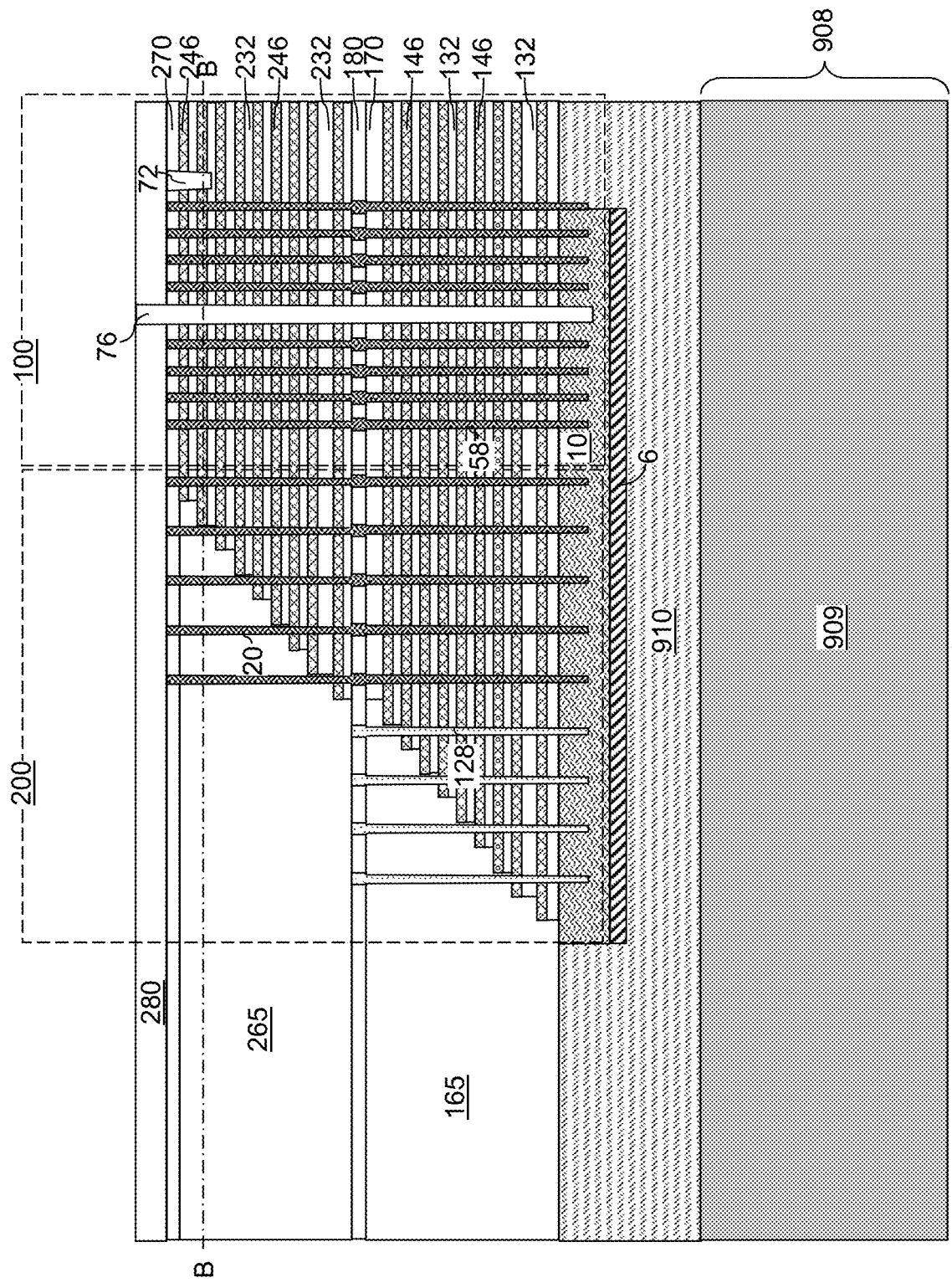
FIG. 14A is a vertical cross-sectional view of the exemplary structure after formation of backside trench fill structures in the backside trenches according to the first embodiment of the present disclosure.
Figure 14C:
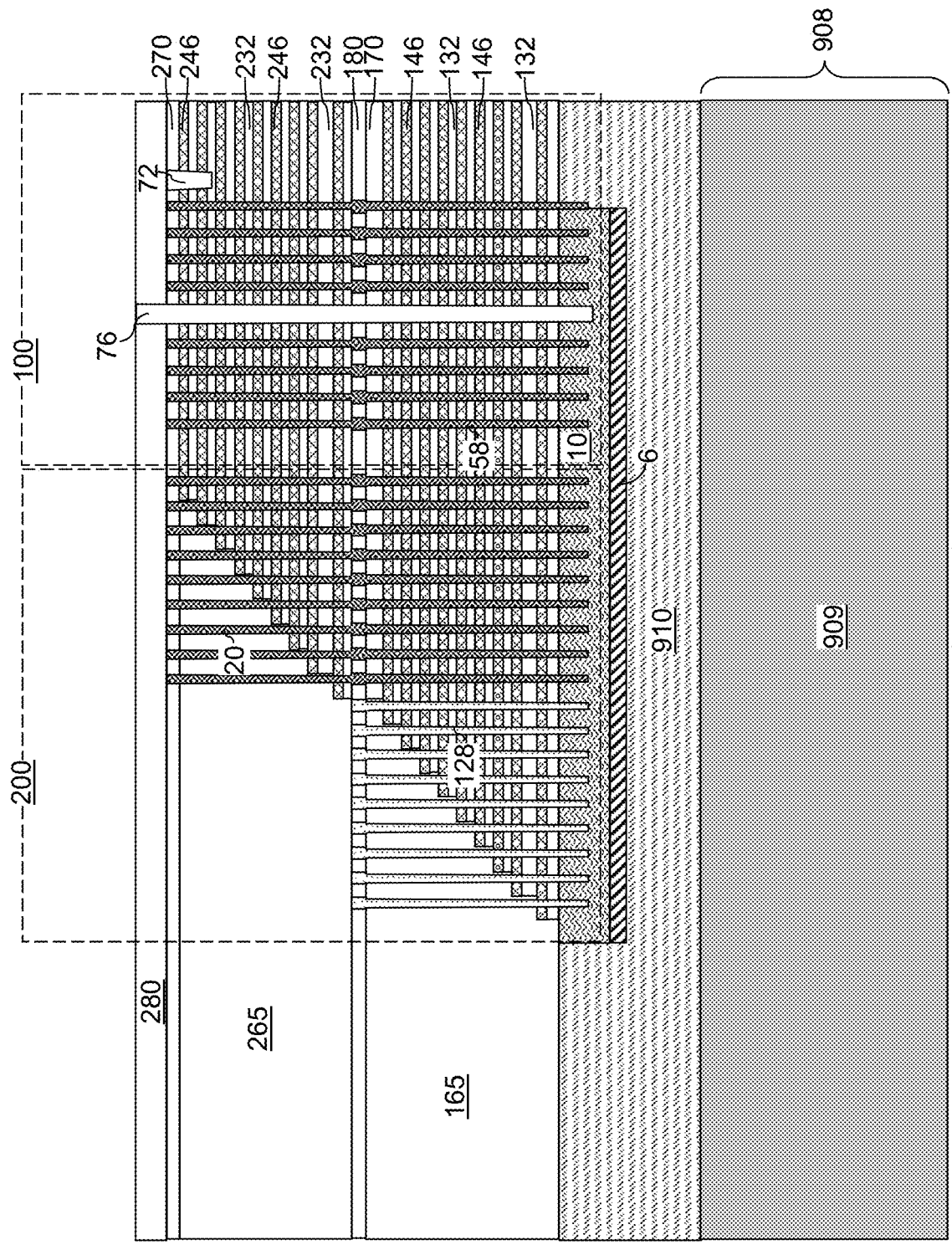
FIG. 14C is a vertical cross-sectional view of the exemplary structure along the vertical plane C-C' of FIG. 14B.

Referring to FIGS. 14A-14C, a backside trench fill structure 76 may be formed within each backside trench 79. Each backside trench fill structure 76 may consist of at least one dielectric fill material such as silicon oxide, silicon nitride, and/or a dielectric metal oxide material. Alternatively, the backside trench fill structure 76 may include a laterally-insulated source contact via structure that includes a conductive via structure contacting the source semiconductor layer 10 and a dielectric spacer that laterally surrounds the conductive via structure.

Figure 15A:
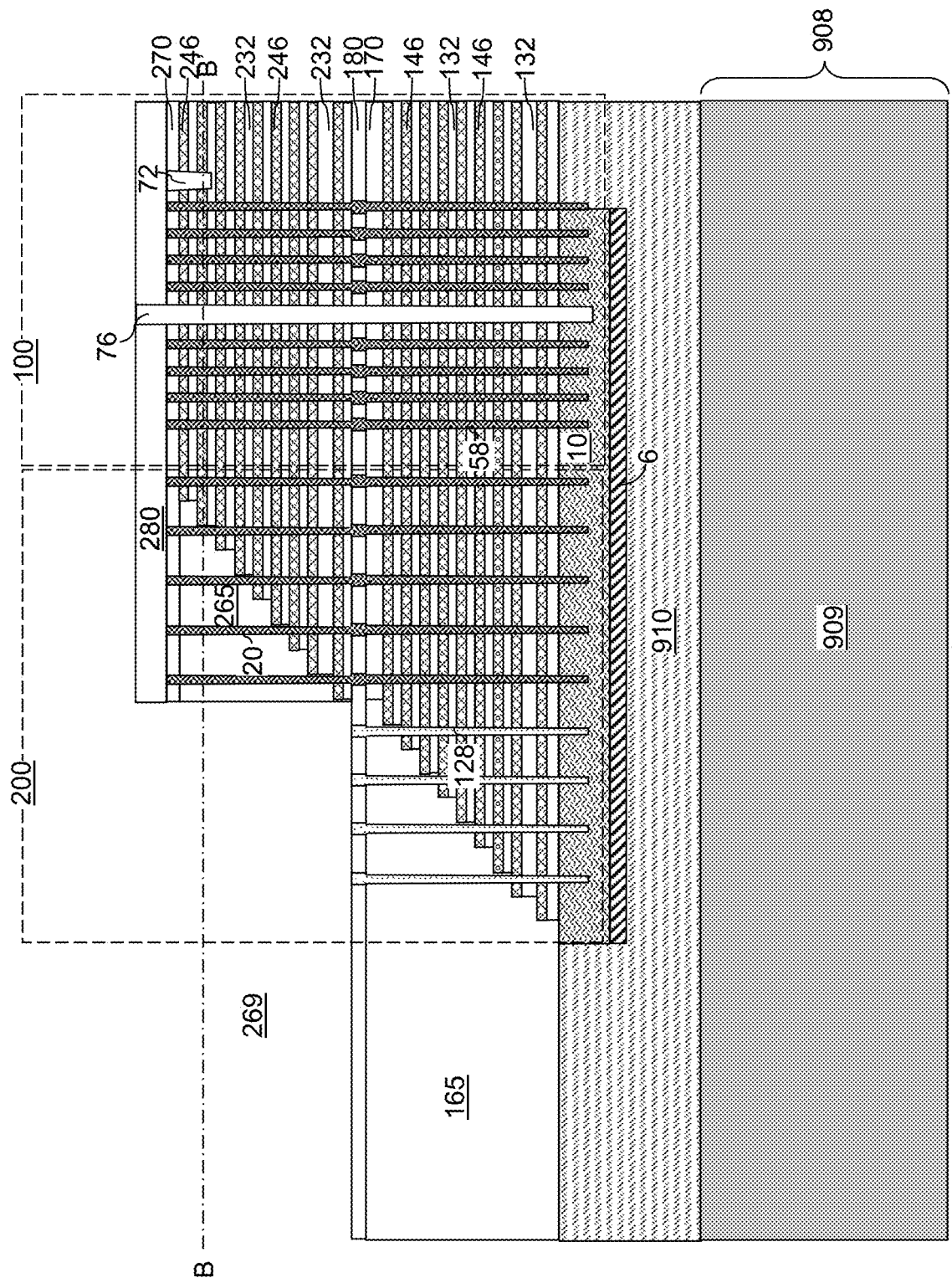
FIG. 15A is a vertical cross-sectional view of the exemplary structure after formation of memory-side recess regions according to the first embodiment of the present disclosure.
Figure 15B:
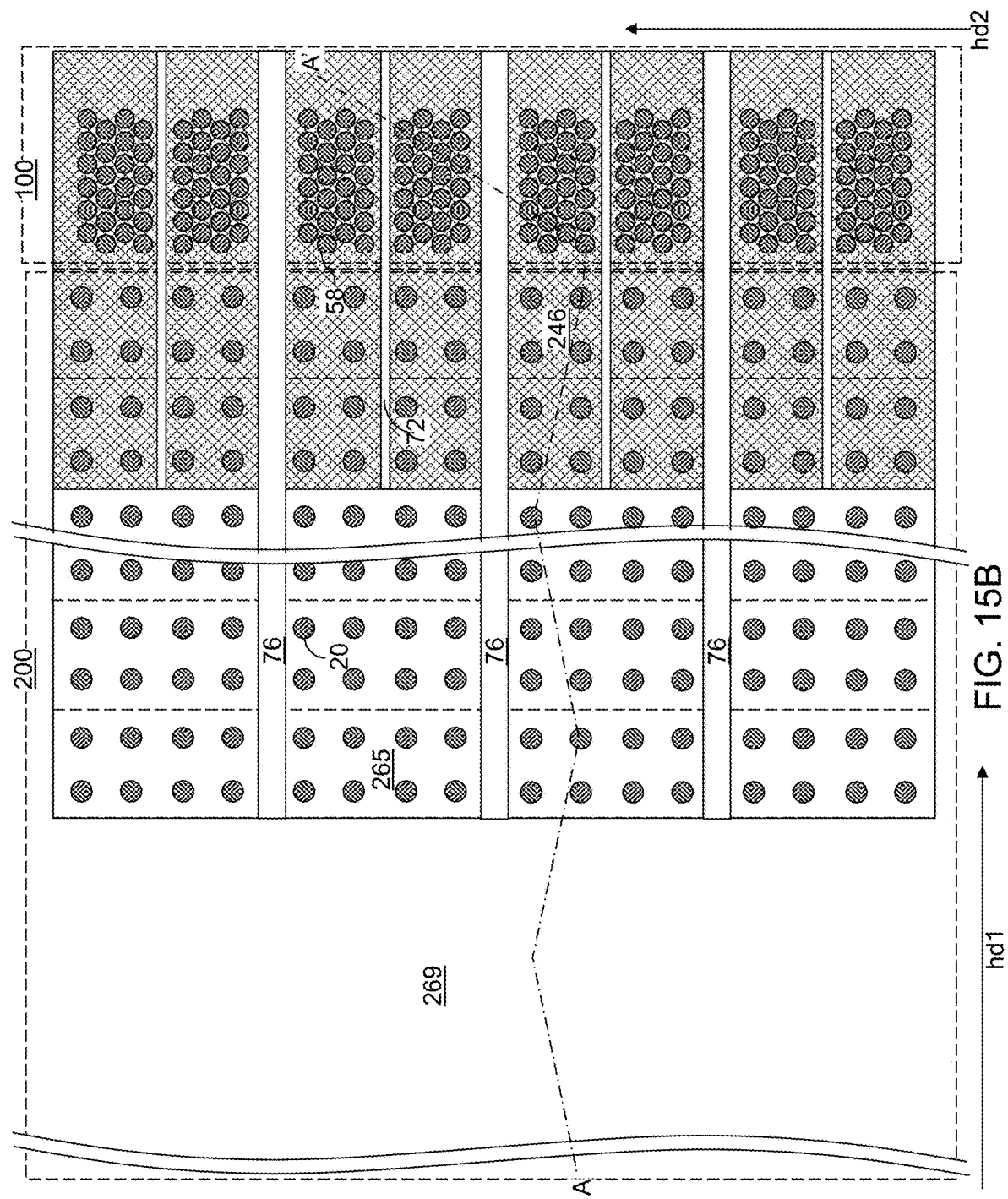
FIG. 15B is a horizontal cross-sectional view of the exemplary structure along the vertical plane B-B' of FIG. 15A. The hinged vertical plane A-A' corresponds to the plane of the vertical cross-sectional view of FIG. 15A.

Referring to FIGS. 15A and 15B, memory-side recess regions 269 can be formed in areas 69 of the staircase regions 200 in which the second retro-stepped dielectric material portion 265 contacts a top surface the inter-tier dielectric layer 180. For example, a photoresist layer (not shown) can be applied over the contact-level dielectric layer 280, and can be lithographically patterned to form openings within the areas 69 of contact between the second retro-stepped dielectric material portion 265 and the inter-tier dielectric layer 180. An anisotropic etch process can be performed to vertically recess unmasked portions of the contact-level dielectric layer 280 and the second retro-stepped dielectric material portions 265 across the in-process memory die. If the support pillars 20 are present in areas 69, then the support pillars 20 are etched as well. Recesses formed by removal of the materials of the contact-level dielectric layer 280 and the second retro-stepped dielectric material portions 265 (and optionally the support pillars 20) in areas 69 constitute the memory-side recess regions 269. In one embodiment, a top surface of the inter-tier dielectric layer 180 may be exposed at the bottom of the memory-side recess regions 269. Each memory-side recess region 269 can have a set of straight sidewalls that continuous extend from a top surface of the contact-level dielectric layer 180 to the inter-tier dielectric layer 280. The photoresist layer can be subsequently removed, for example, by ashing.

Figure 16A:
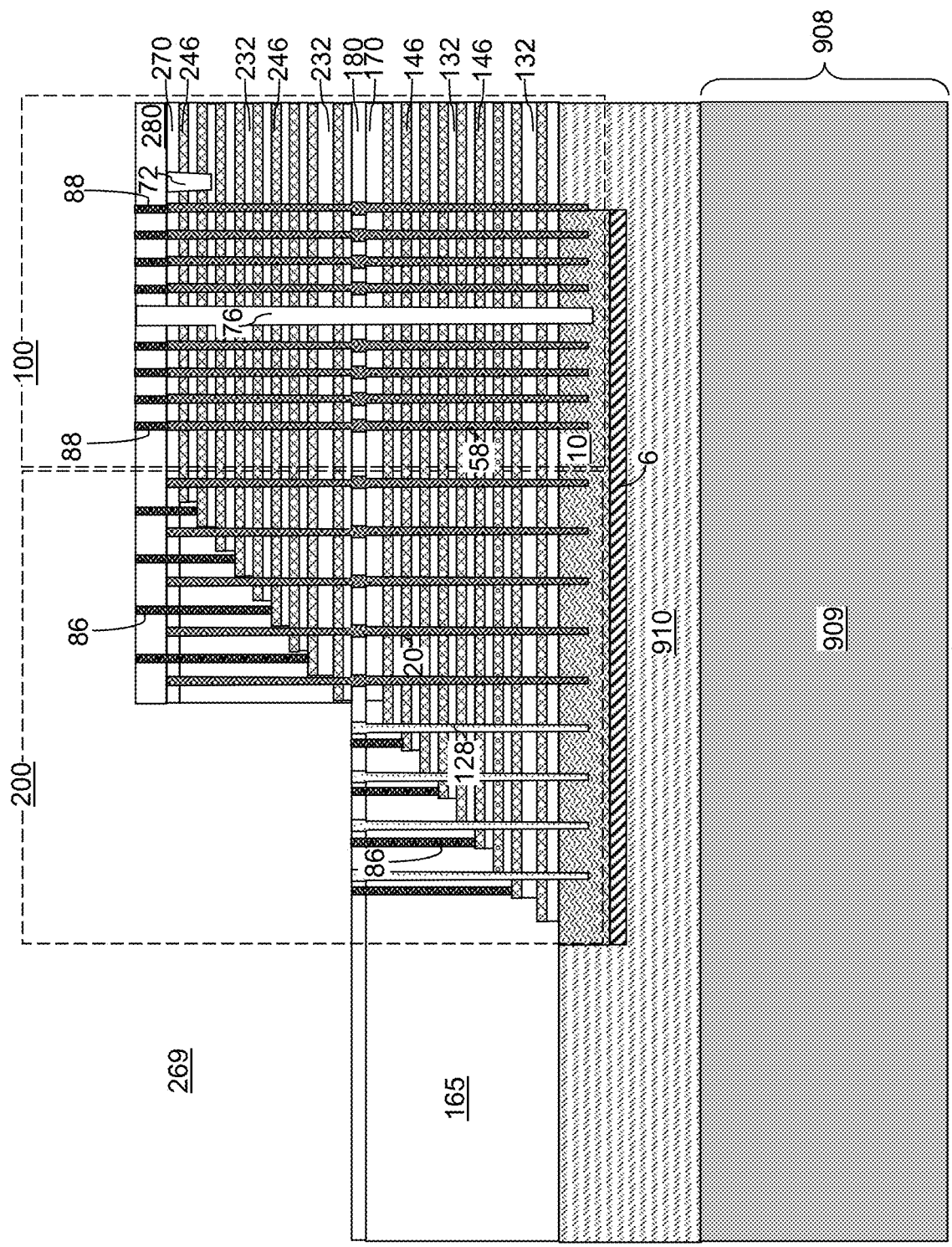
FIG. 16A is a vertical cross-sectional view of the exemplary structure after formation of contact via structures according to the first embodiment of the present disclosure.
Figure 16B:
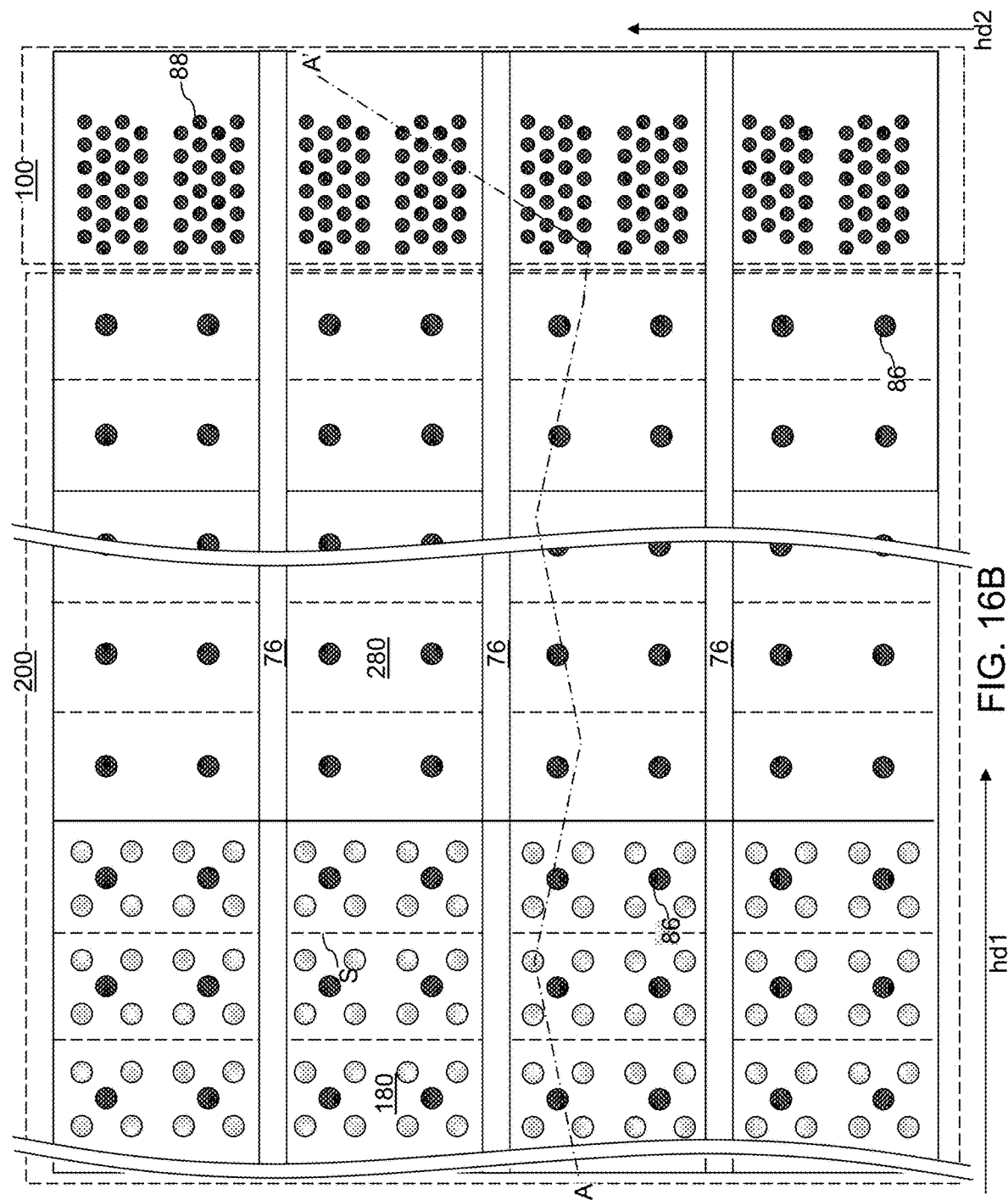
FIG. 16B is a horizontal cross-sectional view of the exemplary structure along the vertical plane B-B' of FIG. 16A. The hinged vertical plane A-A' corresponds to the plane of the vertical cross-sectional view of FIG. 16A.

Referring to FIGS. 16A and 16B, at least one photoresist layer (not shown) can be applied over the in-process memory die, and can be lithographically patterned to form various contact via openings. For example, openings for forming drain contact via structures 88 may be formed in the memory array region 100, and openings for forming staircase region contact via structures 86 may be formed in the staircase region 200. An anisotropic etch process is performed to transfer the pattern in the photoresist layer through the contact-level dielectric layer 280 and underlying dielectric material portions. The drain regions 63 and the electrically conductive layers (146, 246) may be used as etch stop structures. Drain contact via cavities may be formed over each drain region 63, and staircase-region contact via cavities may be formed over each electrically conductive layer (146. 246) at the stepped surfaces underlying the first and second stepped dielectric material portions (165, 265). The photoresist layer may be subsequently removed, for example, by ashing.

In one embodiment, a first photoresist layer may be applied and patterned to form openings for forming drain contact via cavities and a first subset of the staircase-region contact via cavities that extend to a respective second electrically conductive layer 246. In this case, all openings in the first photoresist layer can be formed outside the memory-side recess regions 269, and each memory-side recess region 269 can be covered by the first photoresist layer. The drain contact via cavities and the first subset of the staircase-region contact via cavities can be formed by a first anisotropic etch process. The first photoresist layer may be removed after formation of the drain contact via cavities and the first subset of the staircase-region contact via cavities. A second photoresist layer can be applied over the in-process memory die, and can be lithographically patterned to form openings for a second subset of the staircase-region contact via cavities that extend to a respective first electrically conductive layer 146. In this case, all openings in the second photoresist layer can be formed within the memory-side recess regions 269, and the memory array region 100 and areas of the staircase region 200 including the first subset of the staircase-region contact via cavities can be covered by the second photoresist layer. The second subset of the staircase-region contact via cavities can be formed by a second anisotropic etch process. The second photoresist layer can be removed after formation of the second subset of the staircase-region contact via cavities.

Alternatively, a single photoresist layer may be employed to pattern openings for the drain contact via cavities, the first subset of the staircase-region contact via cavities, and the second subset of the staircase-region contact via cavities. In this case, a single anisotropic etch process can be employed to simultaneously form the drain contact via cavities, the first subset of the staircase-region contact via cavities, and the second subset of the staircase-region contact via cavities. The single photoresist layer may be subsequently removed.

At least one conductive material can be deposited in each of the drain contact via cavities and the staircase-region contact via cavities. The at least one conductive material can include, for example, a combination of a metallic nitride liner material (such as TiN, TaN, or WN) and a metallic fill material (such as W, Cu, Ru, Co, Mo, etc.). Excess portions of the at least one conductive material can be removed from above the contact-level dielectric layer 280 and the inter-tier dielectric layer 180 by a recess etch process.

Drain contact via structures 88 are formed in the drain contact via cavities and on a top surface of a respective one of the drain regions 63. Staircase-region contact via structures 86 are formed in the staircase-region contact via cavities and on a top surface of a respective one of the electrically conductive layers (146, 246). The staircase-region contact via structures 86 may include source and drain select level contact via structures that contact a subset of the second electrically conductive layers 246 that function as respective source and drain select level gate electrodes. Further, the staircase-region contact via structures 86 may include word line contact via structures that contact electrically conductive layers (146, 246) that overlie the source select level gate electrodes and that underlie the drain select level gate electrodes and function as word lines for the memory stack structures 55.

In an alternative embodiment, the second subset of the staircase-region contact via structures 86 that contact a respective one of the first electrically conductive layers 146 can be formed prior to formation of the second-tier structure, i.e., prior to formation of the second alternating stack of second insulating layers 132 and second sacrificial material layers 142. For example, the second subset of the staircase-region contact via structures 86 can be formed through a respective one of the first retro-stepped dielectric material portion 165 onto a top surface of a respective first sacrificial material layer 142 after the processing steps of FIG. 5 and prior to the processing steps of FIG. 6.

Figure 17:
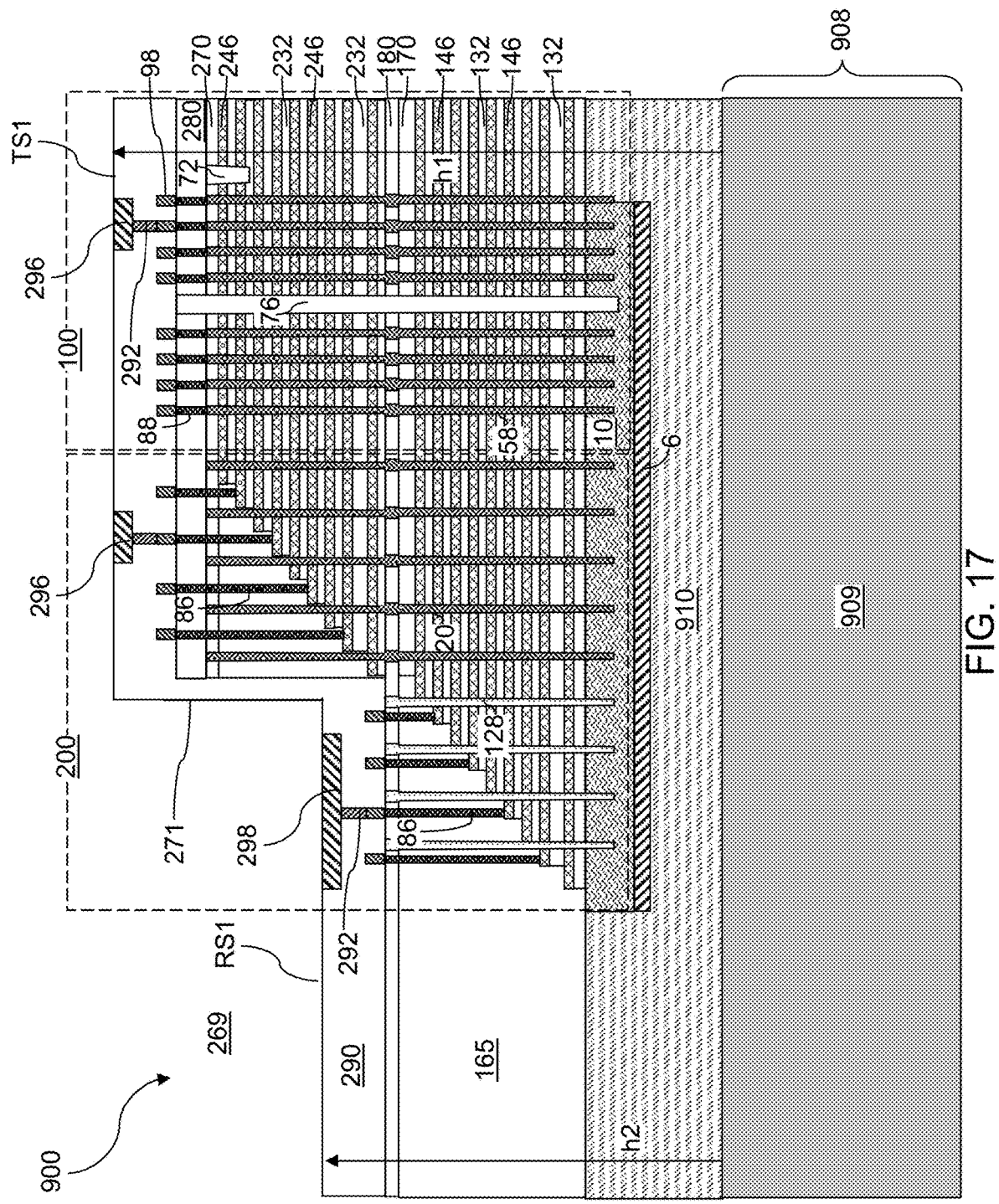
FIG. 17 is a vertical cross-sectional view of a portion of a first semiconductor die containing the exemplary structure after formation of metal interconnect structures including first bonding pads according to the first embodiment of the present disclosure.

Referring to FIG. 17, at least one device-interconnection dielectric layer 290 may be formed over the contact-level dielectric layer 280 and the inter-tier dielectric layer 180 by a conformal or non-conformal deposition process. The at least one device-interconnection dielectric layer 290 includes a dielectric material such as undoped silicate glass, a doped silicate glass, and/or silicon nitride. Bit lines 98 are formed in electrical contact with the drain contact via structures 88. Memory device metal interconnect structures 292, first bonding pads 298, and metal contact structures 296 can be formed within the at least one device-interconnection dielectric layer 290.

The memory device metal interconnect structures 292 can be electrically connected to a respective one of the bit lines 98 and the staircase-region contact via structures 86. The memory device metal interconnect structures 292 provide interconnection between nodes of the memory elements in the three-dimensional array of memory elements in the memory die and logic circuits in a logic die to be subsequently bonded to the memory die. The memory device metal interconnect structures 292 are embedded within the device-interconnection dielectric layer 290, and can include various metal lines and/or metal via structures. In one embodiment, the memory device metal interconnect structures 292 may include bit line interconnect structures that electrically contact the bit lines 98, and word lines interconnect structures that electrically contact the word lines (146, 246).

FIG. 17 illustrates a first semiconductor die according to the first embodiment of the present disclosure. In the first embodiment, the first semiconductor die comprises a memory die 900. The memory die 900 includes a stepped top surface, which includes a topmost memory die surfaces TS1 located at a first height h1 from a top surface of the first substrate 908 in a first area (which includes the areas of a memory array region 100 and a proximal portion of a staircase region 200) and further includes at least one recessed memory die surface RS1 (which can be a plurality of recessed memory die surfaces RS) located at a second height h2 from the top surface of the first substrate 908 in at least one second area (which include the area of a distal portion of a staircase region 200). Connecting sidewalls 271 laterally surround each recessed memory die surface RS1, and connect each recessed memory die surface RS1 to the topmost memory die surfaces TS1. The connecting sidewalls 271 may be vertical or tapered. The second height h2 is less than the first height h1. The difference between the first height h1 and the second height h2 can be about the sum of the thickness of the second alternating stack (232, 246) and the thickness of the contact-level dielectric material layer 280. In one embodiment, the difference between the first height h1 and the second height h2 can be in a range from 5 microns to 30 microns, although lesser and greater differences can also be employed.

The first bonding pads 298 can be formed by recessing discrete portions of the recessed memory die surfaces RS1, and by filling recessed volumes with at least one metallic material that can be employed for metal-to-metal bonding, such as copper. The first bonding pads 298 can be formed by an electroless plating or electroplating process that employs underlying physically exposed surfaces of the memory device metal interconnect structures 292 as growth surfaces. The duration of the plating process can be selected such that the first bonding pads 298 fill the recessed volumes. Generally, the first bonding pads 298 can be formed within the three-dimensional memory device of the memory die 900. The first bonding pads 298 can have a respective top surface adjoined to the at least one recessed memory die surface RS1. In this case, a periphery of the top surface of each first bonding pad 298 can contact a respective recessed memory die surface RS1.

The metal contact structures 296 can be formed by recessing discrete portions of the topmost memory die surfaces TS1, and by filling recessed volumes with at least one metallic material such as copper. The metal contact structures 296 can be formed by electroless plating or electroplating and an optional planarization process such as a chemical mechanical planarization process. Generally, the metal contact structures 296 can be formed within the three-dimensional memory device of the memory die 900. The metal contact structures 296 can have a respective top surface adjoined to the topmost memory die surfaces TS1. In one embodiment, each metal contact structures 296 can have a top surface located within a horizontal plane including the topmost memory die surfaces TS1.

Figure 18:
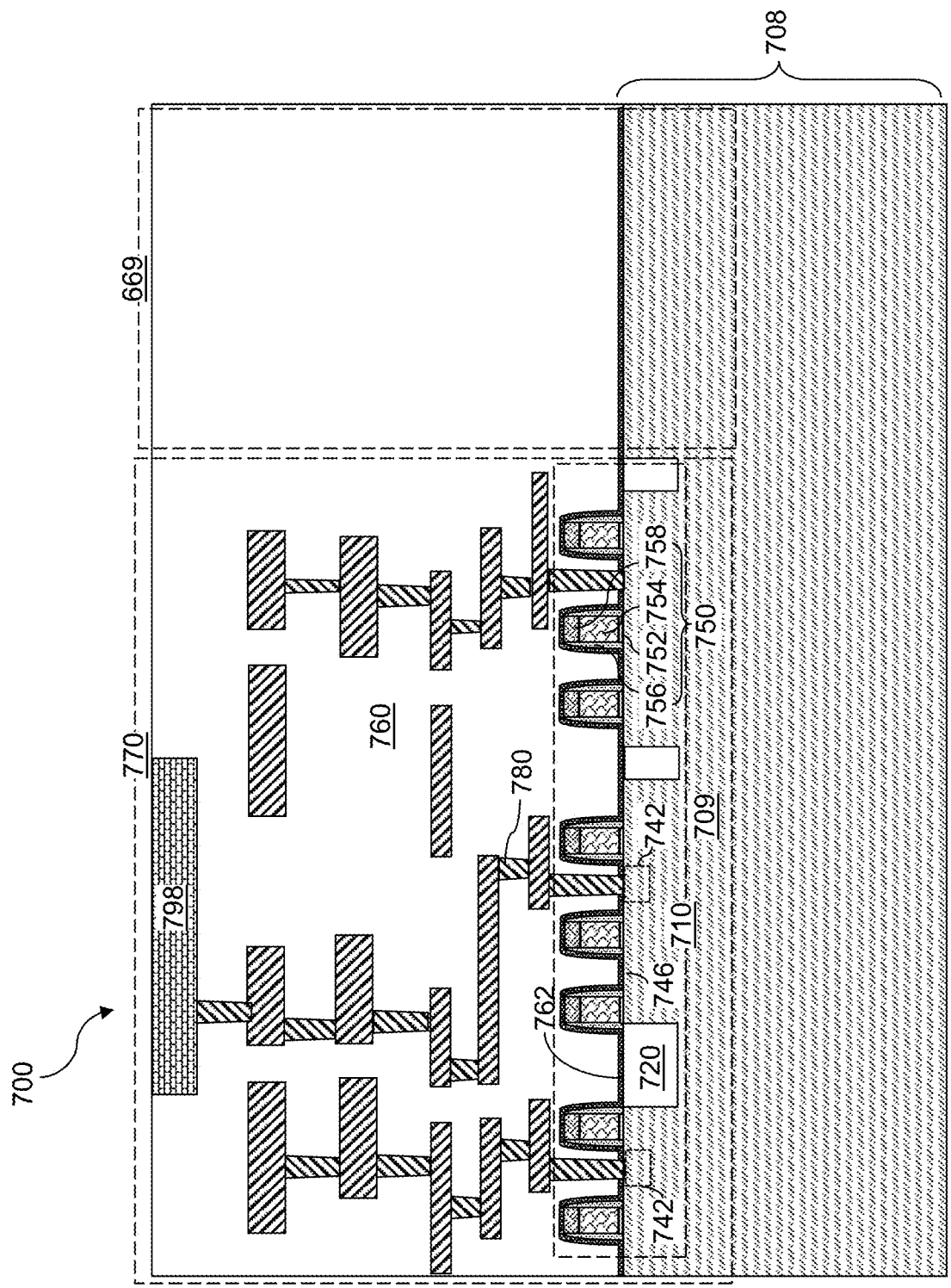
FIG. 18 is a vertical cross-sectional view of a portion of a second semiconductor die after formation of logic circuits on a second substrate according to the first embodiment of the present disclosure.

Referring to FIG. 18, a second die is illustrated. In the first embodiment of the present disclosure, the second die may be a logic die 700 which includes support (e.g., driver) circuitry. The logic die 700 includes a second substrate 708, such as a silicon wafer 709 containing one or more optional wells or layers 710. Semiconductor devices 710 containing complementary metal-oxide-semiconductor (CMOS) devices can be formed on the second substrate 708. The semiconductor devices 710 can be in a pattern that is a mirror image pattern of the areas of the recessed memory die surfaces RS1. In one embodiment, the semiconductor devices 710 can be arranged in clusters, each of which forms a logic circuit configured to drive a segment of the three-dimensional array of memory elements within the memory die 900.

Generally, the semiconductor devices 710 comprise logic circuits 770 that are configured to control the operation of the three-dimensional array of memory elements in the memory die 900 described above. In one embodiment, the semiconductor devices 710 include a peripheral circuitry for operation of the three-dimensional memory arrays in the memory die 900. The peripheral circuitry may include a word line driver that drives word lines of the three-dimensional memory array (comprising the electrically conductive layers (146, 246)) within the memory die 900, a bit line driver that drives the bit lines 98 in the memory die 900, a word line decoder circuit that decodes the addresses for the electrically conductive layers (146, 246), a bit line decoder circuit that decodes the addresses for the bit lines 98, a sense amplifier circuit that senses the states of memory elements within the memory stack structures 55 in the memory die 900, a source power supply circuit that provides power to the source semiconductor layer 10 in the memory die 900, a data buffer and/or latch, or any other semiconductor circuit that may be used to operate the array of memory stack structures 55 in the memory die 900.

Various components of the semiconductor devices 710 can be sequentially formed on the second substrate 708. For example, shallow trench isolation structures 720 may be provided in an upper region of the substrate semiconductor layer 709 to provide electrical isolation between the various semiconductor devices 710. The various semiconductor devices 710 may include field effect transistors, which include respective transistor active regions 742 (i.e., source regions and drain regions), a channel 746, and a gate structure 750. The field effect transistors may be arranged in a CMOS configuration. Each gate structure 750 may include, for example, a gate dielectric 752, a gate electrode 754, a dielectric gate spacer 756 and a gate cap dielectric 758. For example, the semiconductor devices 710 may include word line drivers for electrically biasing word lines of the memory die 900, which comprise the electrically conductive layers (146, 246), and source power supply field effect transistors that generate power to be supplied to the source semiconductor layer in the memory die 900.

Dielectric material layers are formed over the semiconductor devices 710, which are herein referred to as logic-die dielectric material layers 760, or first dielectric material layers. Optionally, a dielectric liner 762 (such as a silicon nitride liner) may be formed to apply mechanical stress to the various field effect transistors and/or to prevent diffusion of hydrogen or impurities from the logic-die dielectric material layers 760 into the semiconductor devices 710. Logic-die metal interconnect structures 780 are formed within the logic-die dielectric material layers 760. The logic-die metal interconnect structures 780 may include various device contact via structures (e.g., source and drain electrodes which contact the respective source and drain nodes of the device or gate electrode contacts), interconnect-level metal line structures, interconnect-level metal via structures, and second bonding pads 798, which may be logic-die bonding pads. The second bonding pads 798 are configured to mate with the first bonding pads 288 of a memory die 900 to provide electrically conductive paths between the memory die 900 and the logic die 700.

Generally, at least one logic circuit, such as a plurality of logic circuits, can be formed on a respective portion of a second substrate 708. In one embodiment, the at least one logic circuit comprises a plurality of logic circuits that are laterally spaced apart by dielectric filled areas 669. Each of the at least one logic circuit comprises a set of field effect transistors and a set of logic-die metal interconnect structures 780 (which are also referred to as first metal interconnect structures) that provides electrical connection between the set of field effect transistors and located within respective logic-die dielectric material layers 760. The second bonding pads 798 may comprise copper or another suitable conductive material, and are formed within an upper region of the logic-die dielectric material layers 760 such that surfaces of the second bonding pads are physically exposed.

Figure 19:
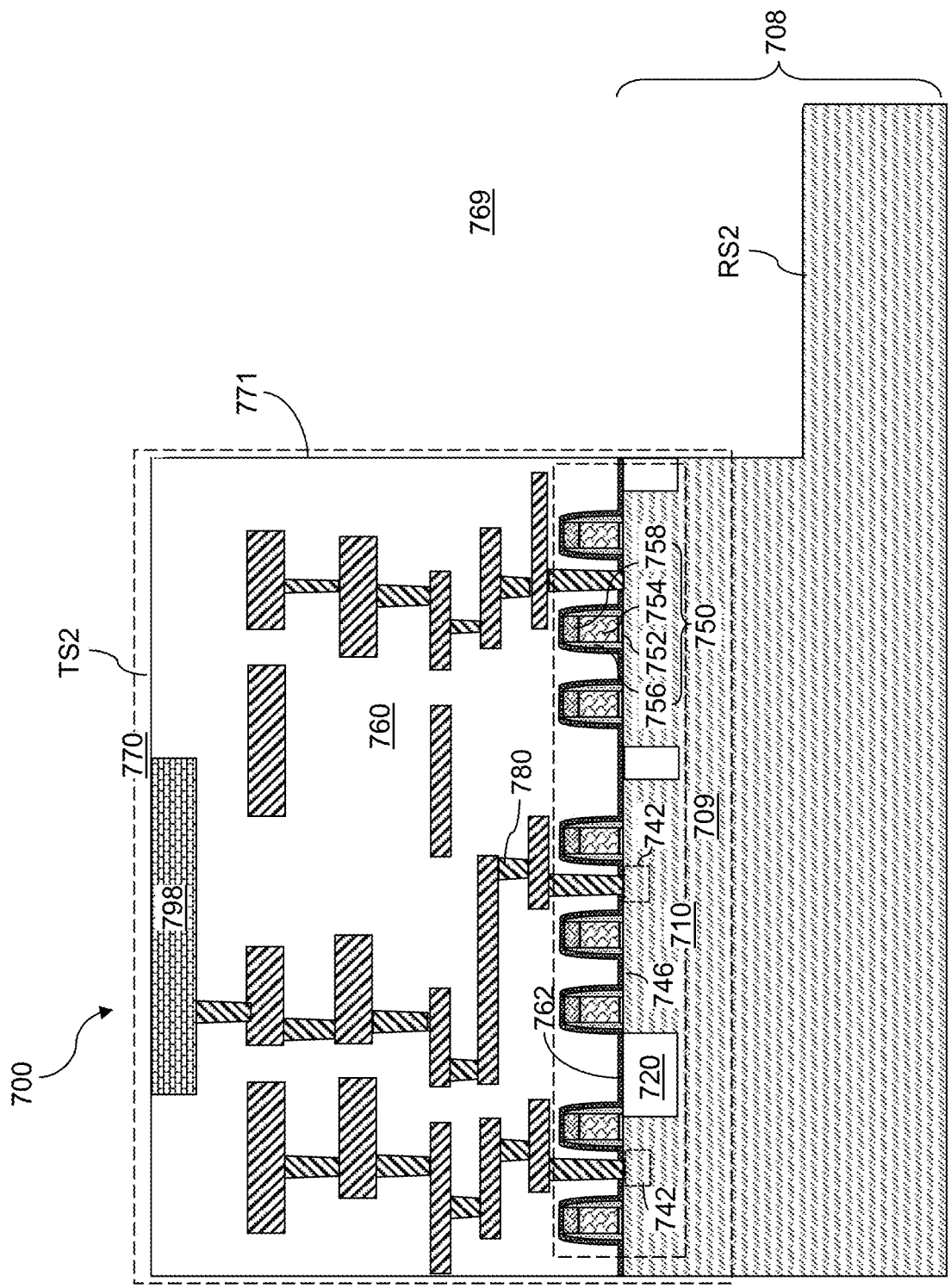
FIG. 19 is a vertical cross-sectional view of a portion of the second semiconductor die after formation of logic-side recess regions according to the first embodiment of the present disclosure.

Referring to FIG. 19, logic-side recess regions 769 can be formed in the areas 669 that correspond to the mirror image of the areas of the topmost memory die surfaces TS1 of the memory die 900. For example, a photoresist layer (not shown) can be applied over the logic-die dielectric material layers 760, and can be lithographically patterned to form openings within the areas 669. An anisotropic etch process can be performed to vertically recess unmasked portions of the logic-die dielectric material layers 760 and optionally a portion of the second substrate 708. The layout of the logic-die metal interconnect structures 780 and the second bonding pads 798 can be selected such that the logic-die metal interconnect structures 780 and the second bonding pads 798 are not present in the areas in which the logic-side recess regions 769 are formed.

Recesses formed by removal of the materials of the logic-die dielectric material layers 760 and optionally the second substrate 708 in areas 669 constitute the logic-side recess regions 769. In one embodiment, a recessed horizontal surface of the second substrate 708 may be exposed at the bottom of the logic-side recess regions 769. Each logic-side recess region 769 can have a set of straight sidewalls that continuous extend from a top surface of the logic-die dielectric material layers 760 to a recessed horizontal surface of the second substrate 708. The photoresist layer can be subsequently removed, for example, by ashing.

The logic die 700 includes a stepped top surface, which includes a second topmost surfaces TS2 located above the topmost surface of the second substrate 708 in an area in which logic circuits are present, and further includes recessed second surface RS2 that are recessed from the topmost surface of the second substrate 708 in areas between the logic circuits. Connecting sidewalls 771 can laterally surround each recessed logic die surface RS2, and connects each recessed logic die surface RS2 to the topmost logic die surfaces TS2. The connecting sidewalls 771 may be vertical or tapered. The height difference between the topmost logic die surfaces TS2 and the recessed logic die surfaces RS2 can be the same as the difference between the first height h1 and the second height h2 of the memory die 900. As discussed above, the difference between the first height h1 and the second height h2 can be in a range from 5 microns to 30 microns, although lesser and greater differences can also be employed.

FIG. 20A-20C are sequential vertical cross-sectional views of an exemplary structure during formation of a bonded assembly according to an embodiment of the present disclosure.

FIG. 20A illustrates the arrangement between the memory die 900 and the logic die 700 during alignment prior to brining the memory die 900 and the logic die 700 into contact each other. The logic die 700 shown in FIG. 20A is turned upside-down with respect to the view shown in FIG. 19 to have the top surface of the logic die 700 face the top surface of the memory die 900. The areas of the topmost logic die surfaces TS2 can be the mirror image of the recessed memory die surfaces RS1, and the areas of the recessed logic die surfaces RS2 can be the mirror image of the topmost memory die surfaces TS1.

FIG. 20B illustrates the bonded assembly of the memory die 900 and a logic die 700 that is provided at the processing step of FIGS. 18 and 19. The memory die 900 and the logic die 700 brought into contact with each other such that the topmost logic die surfaces TS2 of the logic die 700 contact the recessed memory die surfaces RS1 of the memory die 900, and the recessed logic die surfaces RS2 of the logic die 700 contact the topmost memory die surfaces TS1 of the memory die 900. Each of the first bonding pads 298 of the memory die 900 can contact a respective one of the second bonding pads 798 of the logic die 700.

Each logic circuit 770 embedded in a respective recess 269 in the memory die 900. Each logic circuit 770 is located on a respective recessed memory die surface RS1. Generally, the logic circuit 770 can be disposed on a respective one of the at least one recessed memory die surface RS1 such that each set of first metal interconnect structures (logic-die metal interconnect structures 780) is more proximal to the first substrate 908 than the second substrate 708 is to the first substrate 908. In one embodiment, the connecting sidewalls 771 of the at least one logic circuit 770 can be disposed on the connecting sidewalls 271 of the three-dimensional memory device.

An anneal process can be performed to bond the second bonding pads 798 to the first bonding pads 298. The memory die 900 can be bonded to the logic die 700 through metal-to-metal bonding between the first bonding pads 298 and the second bonding pads 798. Alternatively or additionally, the at least one device-interconnection dielectric layer 290 and the logic-die dielectric material layers 760 can include silicon oxide, and oxide-to-oxide bonding can be employed to bond the memory die 900 to the logic die 700. A bonded assembly of the memory die 900 and the logic die 700 can be provided.

Referring again to FIG. 20B, the second substrate 708 can be thinned from the backside, for example, by grinding, polishing, an isotropic etch process (such as a wet etch process), and/or an anisotropic etch process (such as a reactive ion etch process). A distal portion (i.e. a portion that is distal from the vertically undulating interface between the memory die 900 and the logic die 700) of the second substrate 708 is removed by the thinning process. The thinning of the second substrate 708 can continue until the topmost memory die surfaces TS1 are physically exposed. The remaining portions of the second substrate 708 can include multiple semiconductor substrate portions, which are herein referred to as second substrates 708' or logic-die substrates. Each second substrate 708' can be located entirely within a respective area of recessed memory die surface RS1, contacts the connecting sidewalls 271 of the memory die 900 and may be laterally surrounded one at least two sides, such as on 2, 3 or 4 sides, by the areas of the topmost memory die surfaces TS1. In one embodiment, the second substrates 708' can be discrete structures that are laterally spaced apart from each other by regions of the memory die 900 that include the topmost memory die surfaces TS1. Top surfaces of the metal contact structures 296 that are located in the at least one device-interconnection dielectric layer 290 can be physically exposed between neighboring pairs of second substrates 708'.

A plurality of second substrates 708' can be provided. In this case, a plurality of logic circuits 770 located on a respective one of the second substrates 708' can be laterally spaced apart. In other words, the multiple remaining portions of the second substrate 708 after removal of the distal portion of the second substrate 708 can be discrete material portions that are laterally spaced from each other by the regions of the memory die 900 that include the topmost memory die surfaces TS1. Each contiguous assembly of a logic circuit 770 and a second substrate 708' is herein referred to as a logic circuit unit (770, 708'). Each logic circuit unit includes a respective logic circuit 770 therein.

Figure 20D:
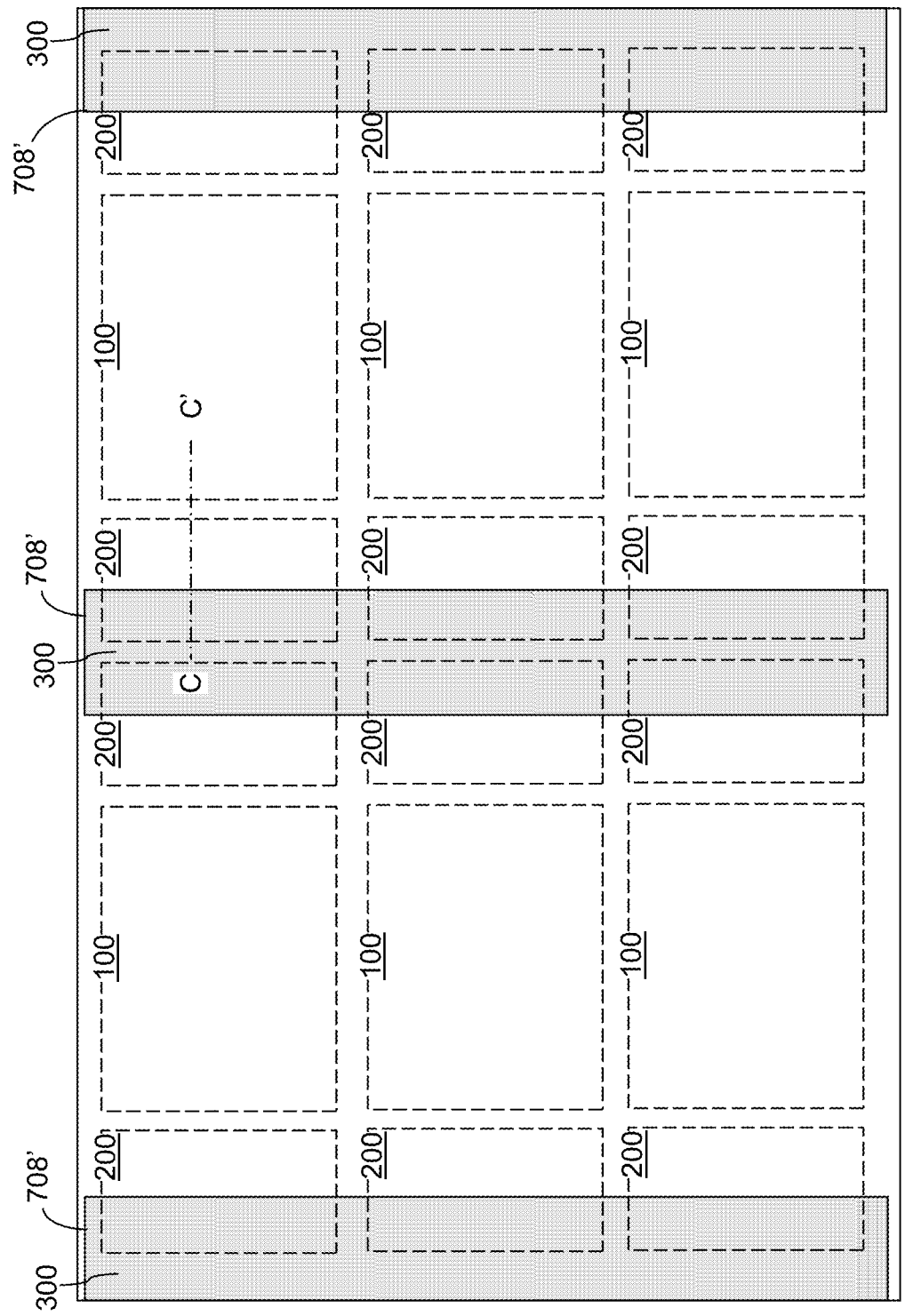
FIG. 20D is a top-down view of the exemplary bonded assembly of FIG. 20C. The vertical plane C-C' corresponds to the plane of the vertical cross-sectional view of FIG. 20C.

Referring to FIGS. 20C and 20D, through-substrate via structures 640 can be formed through the second substrates 708'. Each through-substrate via structure 640 can be formed through a respective second substrate 708', and provides vertical electrical connection between a respective set of first metal interconnect structures (i.e., the logic-die metal interconnect structures 780) and a set of second metal interconnect structures to be subsequently formed on the backside surfaces of the second substrates 708'. Each through-substrate via structure 640 can be electrically isolated from a surrounding second substrate 708' by a tubular dielectric liner (not shown).

Additional dielectric material layers can be formed on the backside surfaces of the second substrates 708' and the topmost memory die surfaces TS1. The additional dielectric material layers are herein referred to as backside dielectric material layers 660 or second dielectric material layers. The backside dielectric material layers 660 can be formed directly on the topmost memory die surfaces TS1 of the memory die 900 and directly on backside surfaces of the second substrates 708, which are remaining portions of the second substrate 708.

A set of additional metal interconnect structures, which are herein referred to as backside metal interconnect structures 680 or second metal interconnect structures, are located in the backside dielectric material layers 660. The backside metal interconnect structures 680 can provide electrically conductive paths between the logic circuits 770 in the logic circuit units (770 708') and the memory device metal interconnect structures 292 of the memory die 900.

Generally, the three-dimensional memory device in the memory die 900 comprises memory device metal contact structures. A subset of the memory device metal contact structures, such as metal contact structures 296, has top surfaces located within a plane including the topmost memory die surfaces TS1, and a subset of the second metal contact structures (i.e., the backside metal interconnect structures 680) contacts the subset of the memory device metal contact structures 296 within the plane including the topmost memory die surfaces TS1 after formation of the second dielectric material layers (i.e., the backside dielectric material layers 660) and the set of second metal interconnect structures (i.e., the backside metal interconnect structures 680).

In the first embodiment described above with respect to FIGS. 1A to 20D, the first semiconductor die 900 included a three-dimensional memory device (e.g., a three-dimensional NAND memory device) and the second semiconductor die 700 included a logic circuit 770 that may be used as a driver circuit for the three-dimensional memory device. However, the present disclosure is not so limited.

In the second embodiment of the present disclosure, the first semiconductor die 900 may include any suitable devices, such as logic devices and/or any suitable two-dimensional and/or three-dimensional memory devices (e.g., NAND, DRAM, SRAM, FeRAM, ReRAM, etc.). Likewise, the second semiconductor die 700 may include any suitable devices, such as logic devices and/or any suitable two-dimensional and/or three-dimensional memory devices (e.g., NAND, DRAM, SRAM, FeRAM, ReRAM, etc.).

FIGS. 21A and 21B are respective vertical cross-sectional views of portions of first semiconductor die 900 and second semiconductor die 700 according to a second embodiment of the present disclosure. The first semiconductor die 900 comprises a first substrate 908 and a first device (100, 200) overlying the first substrate 908. The first semiconductor die 900 includes first areas 169 separated by second areas 69 that will be recessed in a subsequent step.

The second semiconductor die 700 comprises a second substrate 708 and a second device 710 (e.g., plural second devices 710) overlying the second substrate. The second substrate 908 has a distal portion containing a bottom surface 908B facing away from the second device 710. A dielectric layer 760 may be located of the first device 710. The second semiconductor die 700 includes optional areas 669 that will be recessed in a subsequent step.

Figure 22A:
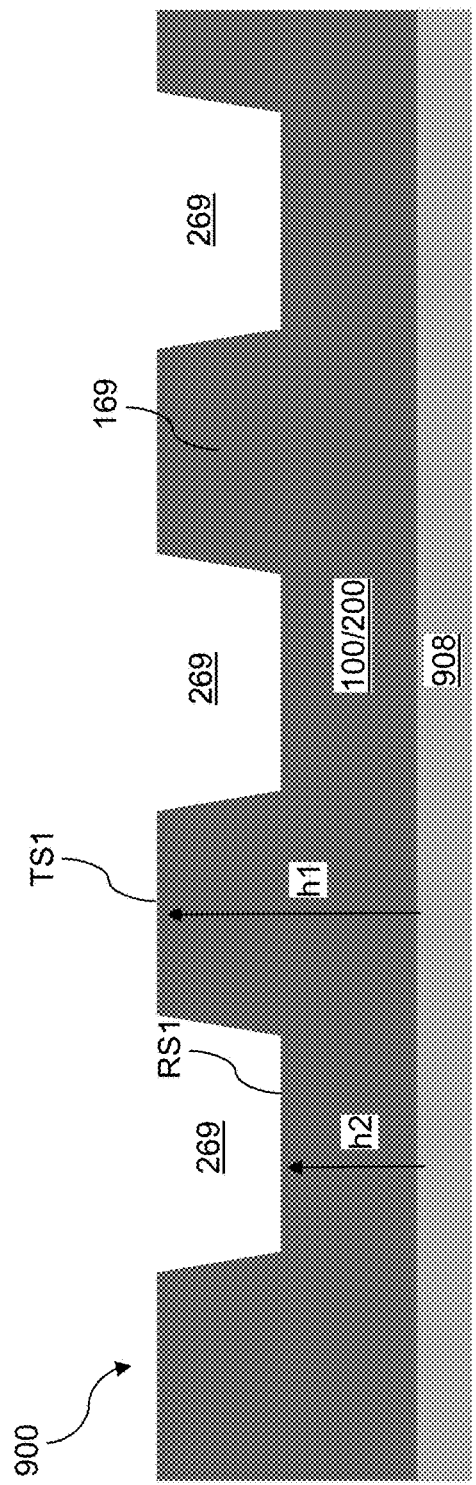
FIGS. 22A and 22B are respective vertical cross-sectional views of portions of first and second semiconductor die after formation of the recesses regions according to a second embodiment of the present disclosure.
Figure 22B:
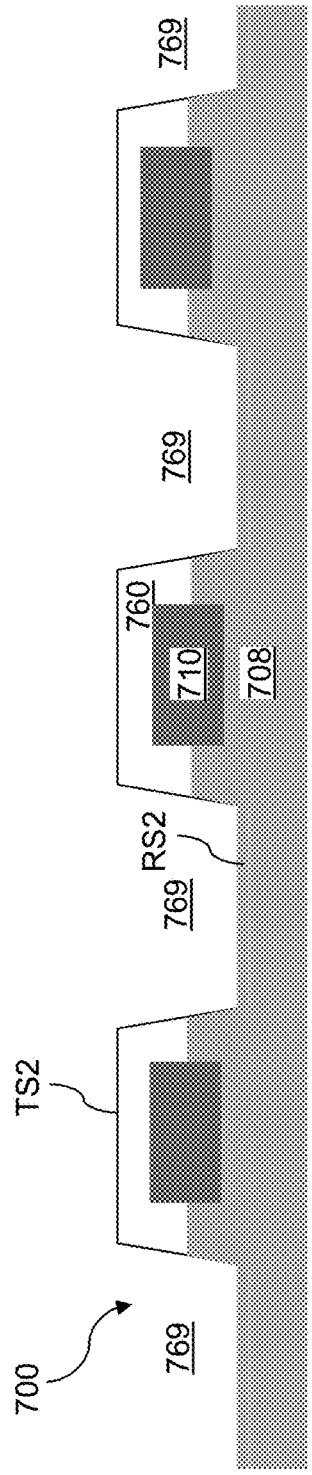

FIGS. 22A and 22B are respective vertical cross-sectional views of portions of first and second semiconductor die after formation of the recesses regions according to a second embodiment of the present disclosure. As shown in these figures, one or more recesses 269 are formed in the areas 69 by etching in the first semiconductor die 900. Optionally, one or more recesses 769 are formed in the areas 669 in the second semiconductor die 700.

The first semiconductor die 900 has a first topmost surface TS1 overlying the first device (100, 200) and a first recessed surface TR1 in the recess 69. The second semiconductor die 700 may have a second topmost surface TS2 overlying the second device 710, and optionally a second recessed surface TR2 in the recess 769.

Figure 23:
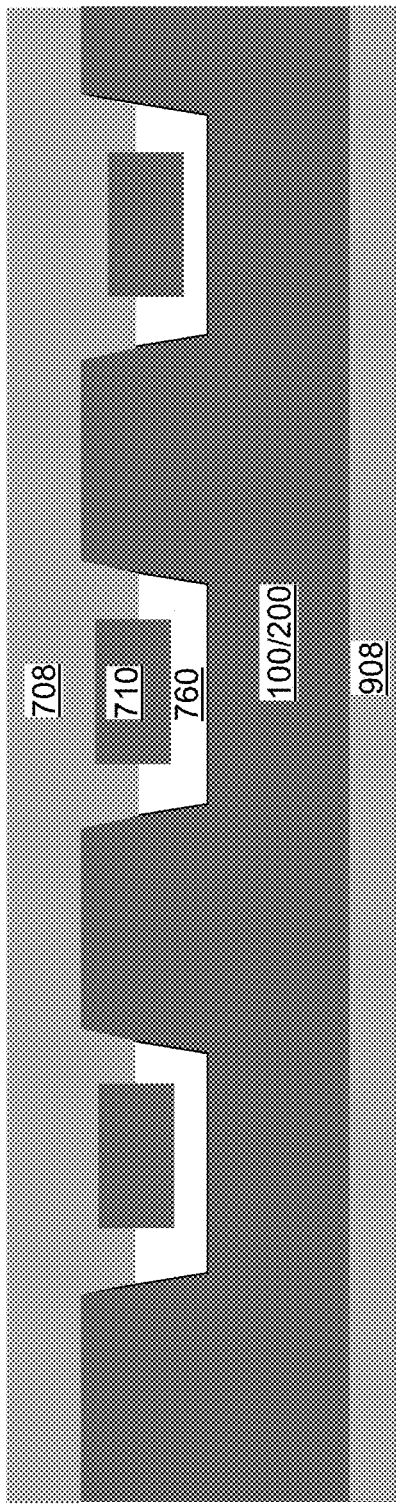
FIG. 23 is a vertical cross-sectional view of an exemplary bonded assembly after bonding the first semiconductor die and the second semiconductor die according to a the second embodiment of the present disclosure.

The second semiconductor die 700 is embedded in the recess 269 in the first semiconductor die 900. If plural recesses 269 and 769 are present, then the second semiconductor die 700 is embedded in the plural recesses 269 in the first semiconductor die 900 as shown in FIG. 23. The first and second semiconductor die are then bonded to each other to form a bonded assembly. The second topmost surface TS2 of the second semiconductor die 700 is bonded to the first recessed surface RS1 of the first semiconductor die 900. FIG. 23 is a vertical cross-sectional view of an exemplary bonded assembly after bonding the first semiconductor die 900 and the second semiconductor die 700 according to a the second embodiment of the present disclosure.

Figure 24:
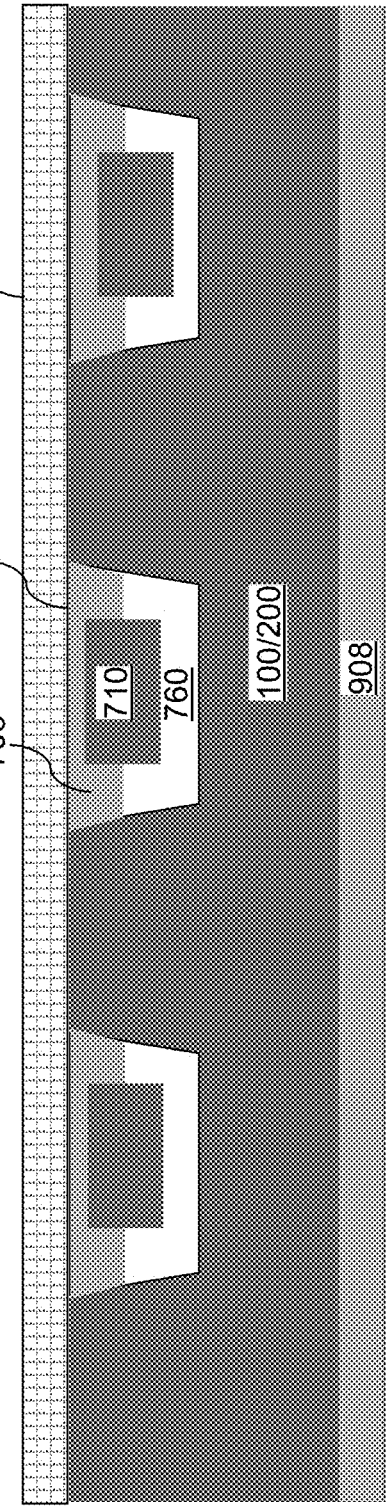
FIG. 24 is a vertical cross-sectional view of the exemplary bonded assembly after thinning the second substrate according to the second embodiment of the present disclosure.

Referring to FIG. 24, a distal portion of the second substrate 708 is removed, such as by CMP or etching of the backside surface 708S of the second substrate 708. A remaining portion of the second substrate 908' is located entirely within the recess 269 after the removal of the distal portion (i.e., thinning) of the second substrate 708. The remaining bottom surface 708S of the remaining portion of the second substrate 708' is coplanar with the first topmost surface TS1 of the first semiconductor die 900. Backside metal interconnection structures 680 and backside dielectric material layer 660 are then over the bottom surface 708S of the second substrate 708' and over the first topmost surface TS1. FIG. 24 is a vertical cross-sectional view of the exemplary bonded assembly after thinning the second substrate according to the second embodiment of the present disclosure.

Figure 25:
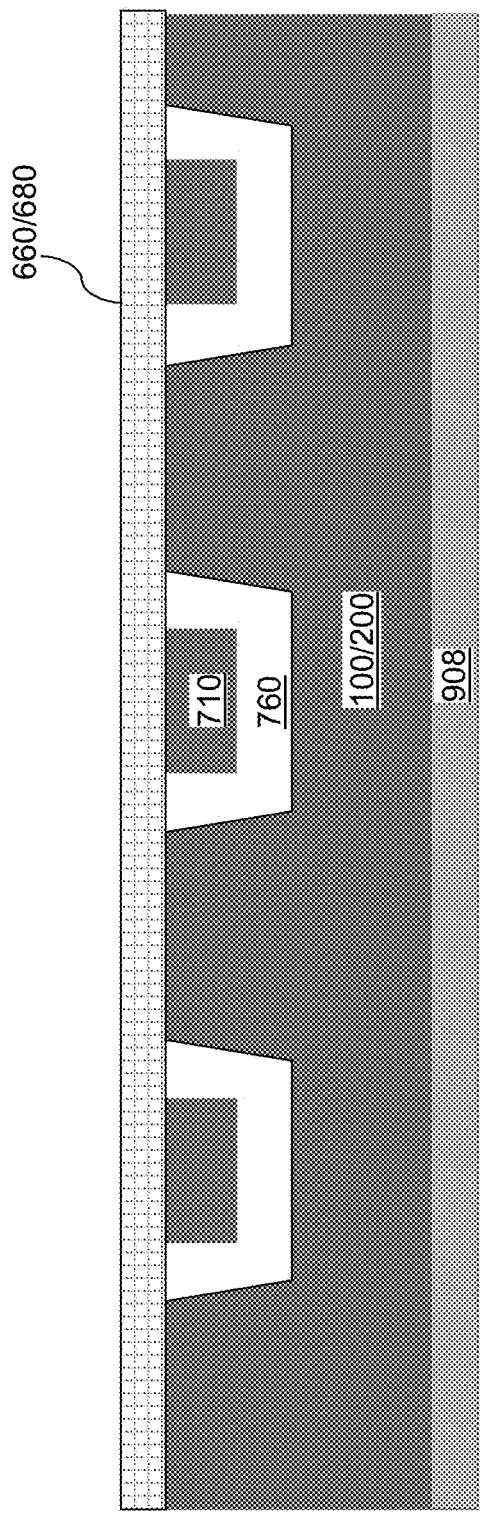
FIG. 25 is a vertical cross-sectional view of the exemplary bonded assembly after removal of the second substrate according to a third embodiment of the present disclosure.

FIG. 25 is a vertical cross-sectional view of the exemplary bonded assembly after removal of the second substrate according to a third embodiment of the present disclosure. In the third embodiment, the second device 710 comprises a thin film transistor that is formed on a removable second substrate, such as a glass, plastic, ceramic or metal substrate. The second substrate is then removed from the thin film transistor 710 before or after the step of bonding. The second substrate may be removed by selective etching or by removing a sacrificial bonding layer which bonds the thin film transistor 710 to the second substrate. In this embodiment, the completed bonded assembly lacks the second substrate. Otherwise, the steps for the third embodiment are the same as for the second embodiment.

Referring to all drawings and according to various embodiments of the present disclosure, a semiconductor structure includes a first semiconductor die 900 containing a recesses 269, and a second semiconductor die 700 which is embedded in the recess 269 in the first semiconductor die 900 and is bonded to the first semiconductor die 900.

In one embodiment, the first semiconductor die 900 comprises a first substrate 908 and a first device (100, 200) overlying the first substrate 908. The first semiconductor die 900 has a first topmost surface TS1 overlying the first device and a first recessed surface RS1 in the recess 269. The second semiconductor die 700 comprises a second substrate 708' and a second device 710 overlying the second substrate 708'. The second substrate 708S has a bottom surface 708S facing away from the second device 710. The second semiconductor die 700 has a second topmost surface TS2 overlying the second device 710. The second topmost surface TS2 of the second semiconductor die 700 is bonded to the first recessed surface RS1 of the first semiconductor die 900. The bottom surface 708S of the second substrate 708' is coplanar with the first topmost surface TS1. Backside metal interconnection structures 680 and backside dielectric material layer 660 are located over the bottom surface 708S of the second substrate 708' and over the first topmost surface TS1.

In one embodiment, the first device (100, 200) comprises a three-dimensional memory device located over the first substrate 908. The first topmost surface TS1 comprises a topmost memory die surface located at a first height h1 from a top surface of the first substrate 908 in a first area 169. The first recessed surface RS1 comprises a recessed memory die surface located at a second height h2 from the top surface of the first substrate 908 in at least one second area 69 containing the recess 269, the second height being less than the first height.

In one embodiment, the second device 710 comprises a logic circuit unit 770 disposed within the recess 269, and the logic circuit unit 770 comprises the second substrate 708', a logic circuit 710, and first metal interconnect structures 780. The first metal interconnect structures 780 are more proximal to the first substrate 908 than the second substrate 708' is to the first substrate 908. In one embodiment, the backside dielectric material layer 660 is in direct contact with the topmost memory die surface TS1.

In one embodiment, through-substrate via structures 640 extend vertically through the second substrate 708' and provide electrical connection between the first metal interconnect structures 780 and the backside metal interconnection structures 680.

In one embodiment, the second substrate 708' is laterally surrounded by, and is contacted by on at least two sides by, a portion of the three-dimensional memory device (100, 200) located within the first area 169. The logic circuit unit 770 is located in the recess 269 and is laterally spaced apart from another logic circuit unit by a portion of the three-dimensional memory device (100, 200) located within the first area 169.

In one embodiment, the three-dimensional memory device (100, 200) comprises first bonding pads 298 having a respective top surface adjoined to the at least one recessed memory die surface RS1, and the logic circuit unit 770 comprises second bonding pads 798 bonded to the respective first bonding pads 298.

In one embodiment, the three-dimensional memory device (100, 200) comprises a three-dimensional NAND memory device which includes at least one alternating stack of insulating layers (132, 232) and electrically conductive layers (146, 246). Memory openings 49 vertically extending through the at least one alternating stack and memory opening fill structures 58 are located within a respective one of the memory openings 49. Each of the memory opening fill structures 58 comprises a vertical semiconductor channel 60 and a memory film 50. The memory film may comprise the tunnel dielectric 56 and the charge storage layer 54. In alternative embodiments, the memory film 50 may comprise floating gates or a ferroelectric material (e.g., orthorhombic hafnium oxide preferably doped with Al, Si or Zr) memory film.

The at least one alternating stack comprises stepped surfaces that continuously extend across the first area 169 and the second area 269. A first retro-stepped dielectric material portion 165 is located on a first portion of the stepped surfaces located in the second area 69. A second retro-stepped dielectric material portion 265 is located on a second portion of the stepped surfaces and located in the first area 169. Contact via structures 86 vertically extend through the first retro-stepped dielectric material portion 165 or the second retro-stepped dielectric material portion 265 and contact a respective one of the electrically conductive layers (146, 246).

In one embodiment, the first contact via structures 86 that extend through the first retro-stepped dielectric material portion 165 contact a first subset of the electrically conductive layers 146. The second contact via structures 86 that extend through the second retro-stepped dielectric material portion 165 contacting a second subset of the electrically conductive layers 246. The second subset of the electrically conductive layers 246 overlies the first subset of the electrically conductive layers 146, top surfaces of the first contact via structures 86 are located underneath a horizontal plane including the recessed memory die surface RS1, and top surfaces of the second contact via structures 86 are located above the horizontal plane including the recessed memory die surface RS1.

The bonded assemblies of the embodiments of the present disclosure provide a smaller total height than conventional bonded assemblies a planar (flat) interface between the bonded die. The total height of the bonded assembly of the embodiments of the present disclosure can be decreased by the difference between the first height h1 and the second height h2 relative to prior art bonded assemblies that have a planar interface between the first die and the second die. Thus, mounting of the bonded assembly of the embodiments of the present disclosure onto a printed circuit board involves a reduced form factor, and provides a higher density packing of semiconductor devices.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

The invention claimed is:

1. A semiconductor structure, comprising:
   a first semiconductor die containing a recess; and
   a second semiconductor die which is embedded in the recess in the first semiconductor die and is bonded to the first semiconductor die;
   wherein:
   the first semiconductor die comprises a first substrate and a first device overlying the first substrate, the first semiconductor die having a first topmost surface overlying the first device and a first recessed surface in the recess;
   the second semiconductor die comprises a second substrate and a second device overlying the second substrate, the second substrate having a bottom surface facing away from the second device, and the second semiconductor die having a second topmost surface overlying the second device;
   the second topmost surface of the second semiconductor die is bonded to the first recessed surface of the first semiconductor die;
   the bottom surface of the second substrate is coplanar with the first topmost surface; and
   backside metal interconnection structures and backside dielectric material layer are located over the bottom surface of the second substrate and over the first topmost surface.

2. The semiconductor structure of claim 1, wherein:
   the first device comprises a three-dimensional memory device located over the first substrate;
   the first topmost surface comprises a topmost memory die surface located at a first height from a top surface of the first substrate in a first area;
   the first recessed surface comprises a recessed memory die surface located at a second height from the top surface of the first substrate in at least one second area containing the recess, the second height being less than the first height;
   the second device comprises a logic circuit unit disposed within the recess;
   the logic circuit unit comprises the second substrate, a logic circuit, and first metal interconnect structures; and
   the first metal interconnect structures are more proximal to the first substrate than the second substrate is to the first substrate.

3. The semiconductor structure of claim 2, wherein the backside dielectric material layer is in direct contact with the topmost memory die surface.

4. The semiconductor structure of claim 2, further comprising through-substrate via structures vertically extending through the second substrate and providing electrical connection between the first metal interconnect structures and the backside metal interconnection structures.

5. The semiconductor structure of claim 4, wherein the second substrate is laterally surrounded by, and is contacted by on at least two sides by, a portion of the three-dimensional memory device located within the first area.

6. The semiconductor structure of claim 5, wherein the logic circuit unit is located in the recess and is laterally spaced apart from another logic circuit unit by a portion of the three-dimensional memory device located within the first area.

7. The semiconductor structure of claim 2, wherein:
   the three-dimensional memory device comprises first bonding pads having a respective top surface adjoined to the at least one recessed memory die surface; and
   the logic circuit unit comprises second bonding pads bonded to the respective first bonding pads.

8. The semiconductor structure of claim 2, wherein the three-dimensional memory device comprises a three-dimensional NAND memory device which includes:
   at least one alternating stack of insulating layers and electrically conductive layers;
   memory openings vertically extending through the at least one alternating stack; and memory opening fill structures located within a respective one of the memory openings, wherein each of the memory opening fill structures comprises a vertical semiconductor channel and a memory film.

9. The semiconductor structure of claim 8, wherein:

the at least one alternating stack comprises stepped surfaces that continuously extend across the first area and the second area;

a first retro-stepped dielectric material portion is located on a first portion of the stepped surfaces located in the second area;

a second retro-stepped dielectric material portion is located on a second portion of the stepped surfaces and located in the first area; and contact via structures vertically extend through the first retro-stepped dielectric material portion or the second retro-stepped dielectric material portion and contact a respective one of the electrically conductive layers.

10. The semiconductor structure of claim 9, wherein the contact via structures comprise:

first contact via structures extending through the first retro-stepped dielectric material portion and contacting a first subset of the electrically conductive layers; and second contact via structures extending through the second retro-stepped dielectric material portion and contacting a second subset of the electrically conductive layers, wherein:

the second subset of the electrically conductive layers overlies the first subset of the electrically conductive layers;

top surfaces of the first contact via structures are located underneath a horizontal plane including the recessed memory die surface; and top surfaces of the second contact via structures are located above the horizontal plane including the recessed memory die surface.

* * * * *